(12) United States Patent
Seo et al.

(10) Patent No.: US 12,713,726 B2
(45) Date of Patent: Aug. 18, 2026

(54) IMAGE SENSOR

(71) Applicant: Samsung Electronics Co., Ltd., Suwon-si (KR)

(72) Inventors: Jae-Kwan Seo, Suwon-si (KR); Nosan Park, Suwon-si (KR); Jung-Kuk Park, Suwon-si (KR); Jinsu Park, Suwon-si (KR); Kookki Lee, Suwon-si (KR); Seul-Young Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 681 days.

(21) Appl. No.: 18/068,723

(22) Filed: Dec. 20, 2022

(65) Prior Publication Data

US 2023/0402476 A1 Dec. 14, 2023

(30) Foreign Application Priority Data

May 18, 2022 (KR) ........................ 10-2022-0060818

(51) Int. Cl.
*H10F 39/00* (2025.01)
*H10F 39/12* (2025.01)
*H10F 39/18* (2025.01)

(52) U.S. Cl.
CPC ....... *H10F 39/8063* (2025.01); *H10F 39/024* (2025.01); *H10F 39/182* (2025.01); *H10F 39/199* (2025.01); *H10F 39/8053* (2025.01); *H10F 39/807* (2025.01); *H10F 39/809* (2025.01); *H10F 39/811* (2025.01)

(58) Field of Classification Search
CPC .... H10F 39/807; H10F 39/199; H10F 39/182; H10F 39/8053; H10F 39/809; H10F 39/024; H10F 39/811; H10F 39/8063
See application file for complete search history.

(56) References Cited

U.S. PATENT DOCUMENTS

| | | | | |
|---|---|---|---|---|
| 7,505,206 | B2 | 3/2009 | Deng et al. | |
| 7,675,102 | B2 | 3/2010 | Kim | |
| 7,763,491 | B2 | 7/2010 | Baek | |
| 9,373,732 | B2 | 6/2016 | Velichko | |
| 10,043,841 | B1 | 8/2018 | Chang et al. | |
| 10,269,844 | B2 | 4/2019 | Cheng et al. | |
| 11,189,654 | B2 | 11/2021 | Chang et al. | |
| 11,323,608 | B2 * | 5/2022 | Pang | H04N 23/67 |

(Continued)

FOREIGN PATENT DOCUMENTS

| | | | |
|---|---|---|---|
| KR | 2003/0016850 | A | 3/2003 |
| KR | 100720514 | B1 | 5/2007 |

(Continued)

*Primary Examiner* — Marlon T Fletcher
*Assistant Examiner* — Kimberly Newman Frey
(74) *Attorney, Agent, or Firm* — Fish & Richardson P.C.

(57) ABSTRACT

An image sensor includes a first substrate including pixel regions, each of the pixel regions including a photoelectric conversion region, color filters on the pixel regions, the color filters on a first surface of the first substrate, micro lenses on the color filters, and a lens coating layer on the micro lenses. The lens coating layer includes a first coating layer and a second coating layer, the second coating layer is on the first coating layer, the first and second coating layers include a same material, and a density of the second coating layer is greater than a density of the first coating layer.

20 Claims, 22 Drawing Sheets

(56) References Cited

U.S. PATENT DOCUMENTS

| | | | | |
|---|---|---|---|---|
| 2011/0241152 | A1* | 10/2011 | Hsiao | H10F 39/014<br>438/73 |
| 2019/0157329 | A1* | 5/2019 | Kim | H10F 39/8053 |
| 2020/0144320 | A1* | 5/2020 | Seo | H10F 39/811 |
| 2020/0185443 | A1 | 6/2020 | Itabasi et al. | |
| 2021/0313371 | A1 | 10/2021 | Yoo et al. | |
| 2022/0037385 | A1* | 2/2022 | Bang | H10F 39/8057 |
| 2022/0120868 | A1* | 4/2022 | Takatsuka | H10F 77/413 |
| 2022/0139989 | A1* | 5/2022 | Park | H10F 39/8063<br>257/432 |
| 2022/0415936 | A1* | 12/2022 | Jeon | H10F 39/182 |
| 2023/0209813 | A1* | 6/2023 | Lee | H10B 12/485<br>438/197 |
| 2025/0133855 | A1* | 4/2025 | Kodama | H10F 39/021 |

FOREIGN PATENT DOCUMENTS

| | | | |
|---|---|---|---|
| KR | 2011-0077116 | A | 7/2011 |
| KR | 2020-0051867 | A | 5/2020 |
| KR | 2020-0145978 | A | 12/2020 |
| KR | 2022-0014951 | A | 2/2022 |
| KR | 2022-0031807 | A | 3/2022 |

* cited by examiner 100a
510A
510B
510C
TR3
VD
510C
TR2
510B
TR1
510A
CF2
CF1
CF2
CF1
CF2
CF1
PD
PX
RP
APS
I
I'
530(LTO)
500
470
PTL2
PTL1
300
320
310
400
200
220
210
100
D3
D2

100a
LMP1
LMP2
LMP3
CF1
CF2
CF1
CF2
CF1
CF2
PD
PD
PD
PD
PD
PD
PX
PX
RP
RP
PX
PX
APS
I
I'
505
PTL2
PTL1
320
310
400
470
300
220
210
200
100
D3
D2

IMAGE SENSOR

CROSS-REFERENCE TO RELATED APPLICATION

This U.S. non-provisional patent application claims priority under 35 U.S.C. § 119 to Korean Patent Application No. 10-2022-0060818, filed on May 18, 2022, in the Korean Intellectual Property Office, the entire contents of which are hereby incorporated by reference.

FIELD

Some example embodiments relate to an image sensor, including an image sensor with improved sensitivity, and/or a method of manufacturing the same.

BACKGROUND

An image sensor may be a device for converting an optical image into electrical signals. Image sensors may be categorized as, for example, charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal.

SUMMARY

Some example embodiments of the inventive concepts may provide an image sensor with improved sensitivity.

Some example embodiments of the inventive concepts may provide a method of manufacturing an image sensor with improved sensitivity.

In an example embodiment, an image sensor includes a first substrate including pixel regions, each of the pixel regions including a photoelectric conversion region, color filters on the pixel regions, the color filters on a first surface of the first substrate, micro lenses on the color filters, and a lens coating layer on the micro lenses, the lens coating layer including a first coating layer and a second coating layer, the second coating layer on the first coating layer, the first and second coating layers including a same material, and a density of the second coating layer greater than a density of the first coating layer.

In an example embodiment, an image sensor includes a first substrate including pixel regions, each of the pixel regions including a photoelectric conversion region, color filters on the pixel regions, the color filters on a first surface of the first substrate, a fence pattern dividing the color filters, a protective layer between the fence pattern and the color filters, micro lenses on the color filters, and a lens coating layer on the micro lenses, the protective layer including a first protective layer and a second protective layer, the first protective layer and the second protective layer sequentially stacked, the first protective layer including aluminum oxide or hafnium oxide, and the second protective layer including silicon oxide.

In an example embodiment, an image sensor includes a circuit chip, and an image sensor chip stacked on the circuit chip. The image sensor chip includes a first substrate comprising photoelectric conversion regions, the first substrate including a first surface and a second surface, and the first surface and the second surface opposite to each other, an isolation pattern in the first substrate to define the photoelectric conversion regions, an insulating layer covering the first surface, color filters on the insulating layer, a fence pattern dividing the color filters, a protective layer between the fence pattern and the color filters, micro lenses on the color filters, a lens coating layer on the micro lenses, a device isolation pattern adjacent to the second surface to define an active region, a buried gate pattern on the second surface, and a first interconnection layer on the buried gate pattern. The circuit chip includes a second substrate, integrated circuits, and a second interconnection layer, the second interconnection layer on the second substrate, the first interconnection layer and the second interconnection layer facing each other and electrically connected to each other, and the integrated circuits on the second substrate, and the lens coating layer includes a first coating layer and a second coating layer, the second coating layer on the first coating layer, the first and second coating layers including a same material, and a density of the second coating layer greater than a density of the first coating layer.

BRIEF DESCRIPTION OF THE DRAWINGS

FIGS. 9, 10, 11, 12, 13, 14 and 15 are cross-sectional views corresponding to the line I-I' of FIG. 6 to illustrate a method of manufacturing an image sensor according to some example embodiments of the inventive concepts.

FIG. 22 is a cross-sectional view corresponding to the line I-I' of FIG. 16 to illustrate a method of manufacturing an image sensor according to another example embodiment.

DETAILED DESCRIPTION

Figure 1:
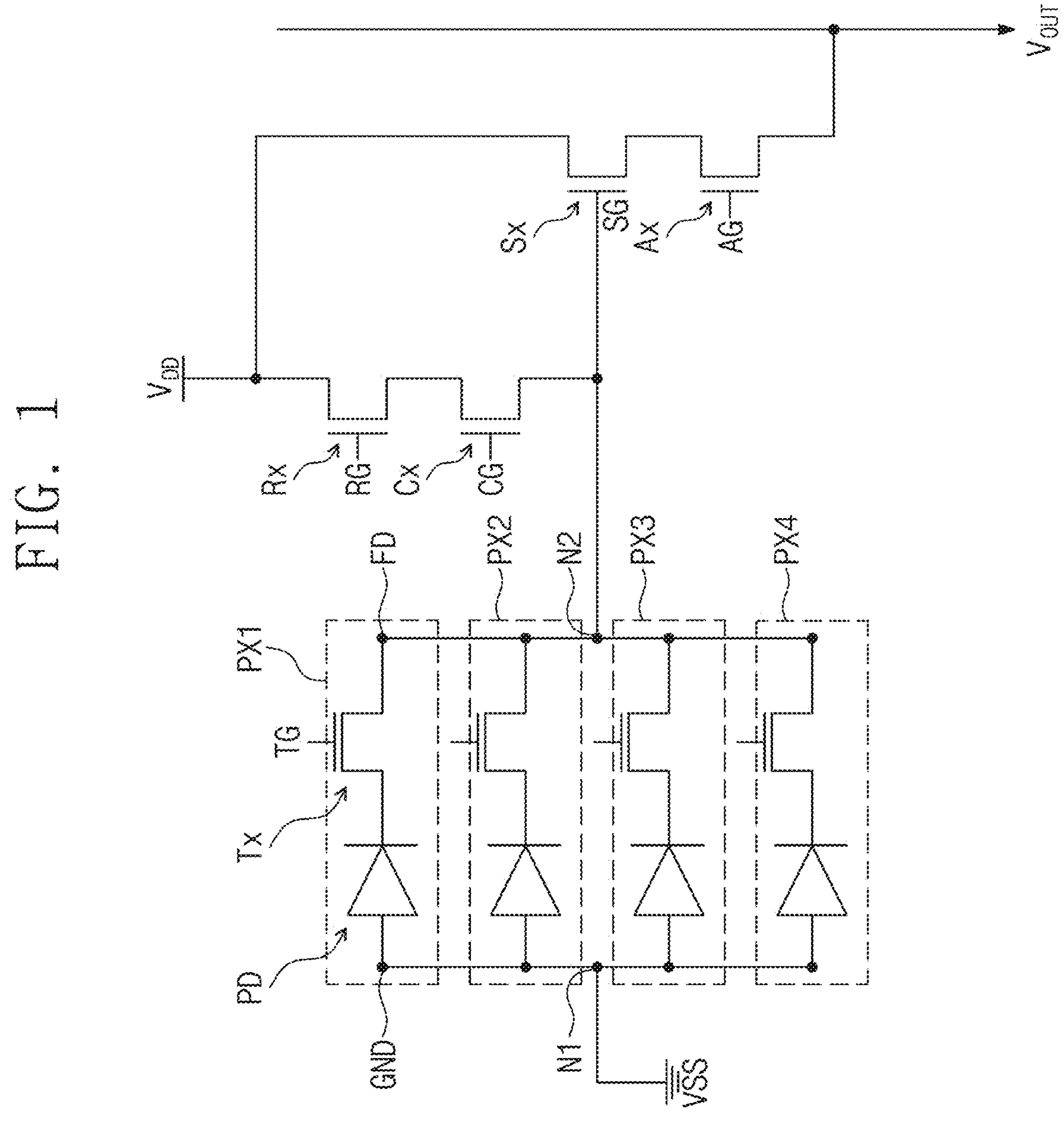
FIG. 1 is a circuit diagram of pixels of an image sensor according to some example embodiments of the inventive concepts.

FIG. 1 is a circuit diagram of pixels of an image sensor according to some example embodiments of the inventive concepts.

Referring to FIG. 1, an image sensor may include first to fourth pixels PX1, PX2, PX3 and PX4. Each of the first to fourth pixels PX1 to PX4 may include a ground region GND, a photoelectric conversion region PD, a transfer transistor Tx, and a floating diffusion region FD.

The ground region GND may include a P-type dopant region. A ground voltage VSS may be applied in common to the ground regions GND of the first to fourth pixels PX1 to PX4 through a first node N1.

The photoelectric conversion region PD may be a photodiode including an N-type dopant region and a P-type dopant region. The floating diffusion region FD may include an N-type dopant region. The floating diffusion region FD may function as a drain of the transfer transistor Tx.

The floating diffusion regions PD of the first to fourth pixels PX1 to PX4 may be connected in common to a second node N2. The second node N2 to which the floating diffusion regions FD of the first to fourth pixels PX1 to PX4 are connected may be connected to a source of a conversion gain transistor Cx. The conversion gain transistor Cx may be connected to a reset transistor Rx.

The second node N2 may be electrically connected to a source follower gate SG of a source follower transistor Sx. The source follower transistor Sx may be connected to a selection transistor Ax.

An operation of the image sensor will be described hereinafter with reference to FIG. 1. First, in a state in which light is blocked, a power voltage $V_{DD}$ may be applied to a drain of the reset transistor Rx and a drain of the source follower transistor Sx, and the reset transistor Rx may be turned-on to discharge charges remaining in the floating diffusion region FD. Thereafter, the reset transistor Rx may be turned-off, and external light may be incident to the photoelectric conversion region PD to generate electron-hole pairs in the photoelectric conversion region PD. The holes may be moved into and accumulated in the P-type dopant region of the photoelectric conversion region PD, and the electrons may be moved into and accumulated in the N-type dopant region of the photoelectric conversion region PD. The transfer transistor Tx may be turned-on to transfer charges (e.g., the electrons or the holes) into the floating diffusion region FD, and the transferred charges may be accumulated in the floating diffusion region PD. A gate bias of the source follower transistor Sx may be changed in proportion to the amount of the charges accumulated in the floating diffusion region FD, thereby causing a change in potential of a source of the source follower transistor Sx. At this time, the selection transistor Ax may be turned-on, and thus a signal generated by the charges may be read through a column line.

An interconnection line may be electrically connected to at least one of a transfer gate TG, the source follower gate SG, a reset gate RG, or a selection gate AG. The interconnection line may be configured to apply the power voltage $V_{DD}$ to the drain of the reset transistor Rx or the drain of the source follower transistor Sx. The interconnection line may include the column line connected to the selection transistor Ax. The interconnection line may include a first conductive structure 830 to be described later in FIG. 3.

FIG. 1 illustrates the first to fourth pixels PX1 to PX4 sharing the first node N1 and the second node N2, but example embodiments of the inventive concepts are not limited thereto.

Figure 2:
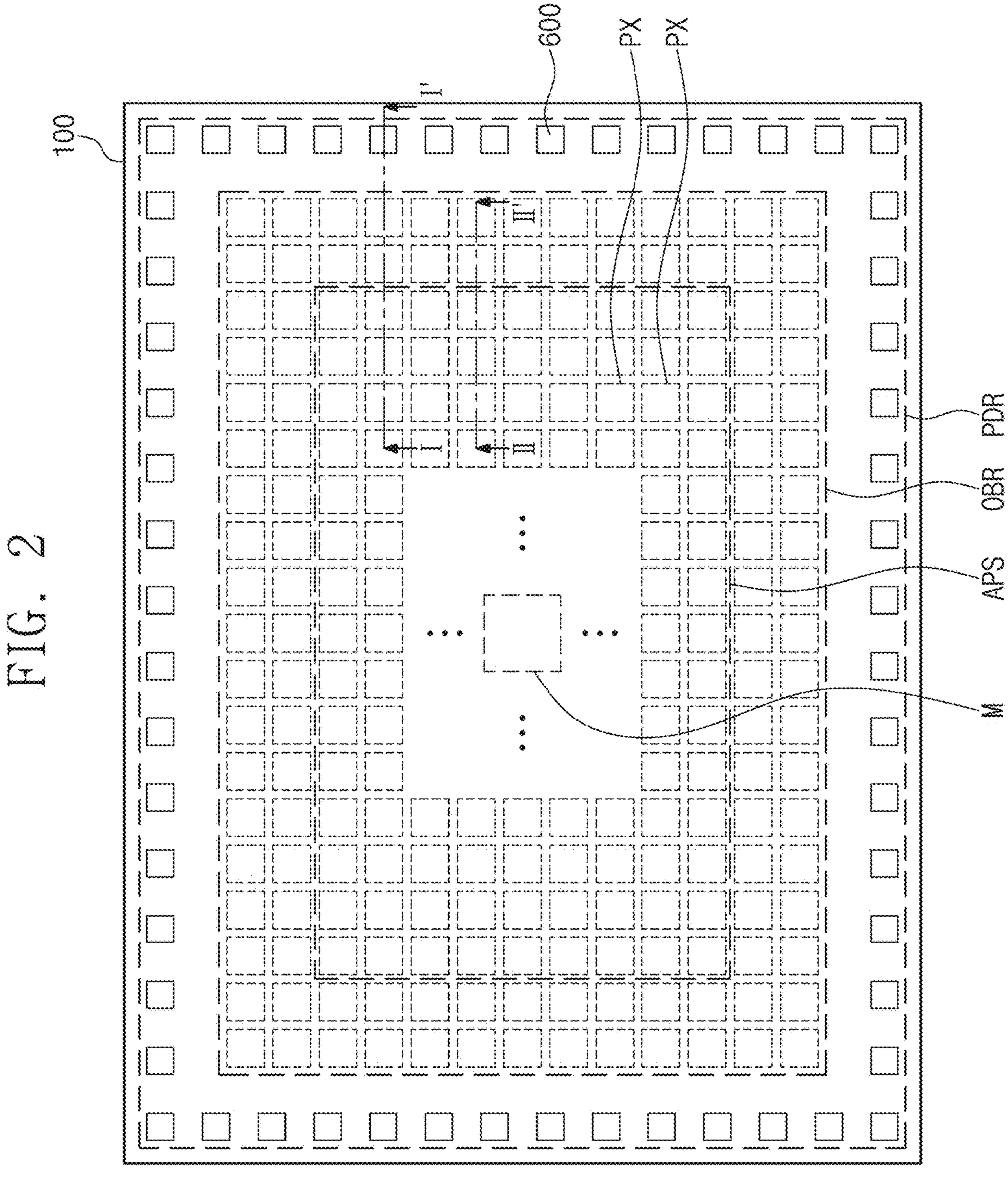
FIG. 2 is a plan view illustrating an image sensor according to some example embodiments of the inventive concepts.
Figure 3:
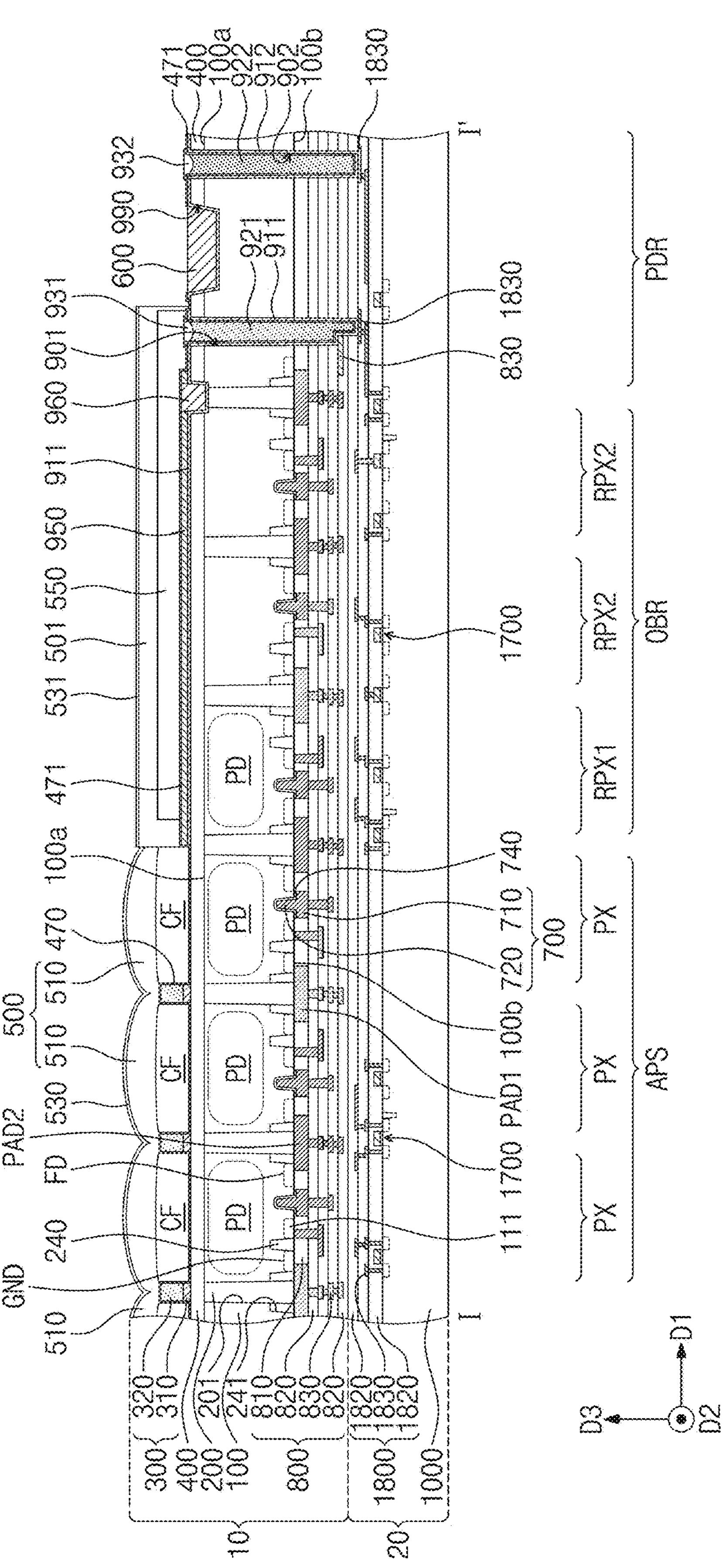
FIG. 3 is a cross-sectional view taken along a line I-I' of FIG. 2.

FIG. 2 is a plan view illustrating an image sensor according to some example embodiments of the inventive concepts. FIG. 3 is a cross-sectional view taken along a line I-I' of FIG. 2.

Referring to FIGS. 2 and 3, an image sensor may include a sensor chip 10. The sensor chip 10 may include a first substrate 100, a first interconnection layer 800, an insulating layer 400, a protective layer 470, color filters CF, a fence pattern 300, and a micro lens layer 500.

The first substrate 100 may include a pixel array region APS, an optical black region OBR, and a pad region PDR when viewed in a plan view. The pixel array region APS may be disposed in a central region of the first substrate 100. The pixel array region APS may include a plurality of pixel regions PX. The pixels described with reference to FIG. 1 may be provided in the pixel regions PX of the first substrate 100, respectively. For example, the components of each of the pixels of FIG. 1 may be provided in each of the pixel regions PX. The pixel regions PX may output photoelectric signals from incident light.

The pixel regions PX may be two-dimensionally arranged to constitute rows and columns. The rows may be parallel or substantially parallel to a first direction D1. The columns may be parallel or substantially parallel to a second direction D2. In some example embodiments, the first direction D1 may be parallel or substantially parallel to a first surface **100*a* of the first substrate 100. The second direction D2 may be parallel or substantially parallel to the first surface 100*a* of the first substrate 100 and may intersect the first direction D1. For example, the second direction D2 may be substantially perpendicular to the first direction D1. A third direction D3 may be perpendicular or substantially perpendicular to the first direction D1 and the second direction D2. For example, the third direction D3 may be substantially perpendicular to the first surface 100*a* of the first substrate 100**.

The pad region PDR may be provided in an edge region of the first substrate 100 to surround the pixel array region APS. External connection pads 600 may be provided on the pad region PDR. The external connection pads 600 may output electrical signals generated from the pixel regions PX to the outside. An external electrical signal or voltage may be transmitted to the pixel regions PX through the external connection pads 600. Since the pad region PDR is disposed in the edge region of the first substrate 100, the external connection pads 600 may be easily connected to an external device. The optical black region OBR will be described later in detail. Hereinafter, the pixel array region APS of the sensor chip 10 of the image sensor will be described in more detail.

The first substrate 100 may have the first surface **100*a* and a second surface 100*b* which are opposite to each other. The first surface 100*a* of the first substrate 100 may be a back surface, and the second surface 100*b* of the first substrate 100 may be a front surface. Light may be incident to the first surface 100*a* of the first substrate 100. The first substrate 100 may be a semiconductor substrate or a silicon-on-insulator (SDI) substrate. For example, the semiconductor substrate may include a silicon substrate, a germanium substrate, or a silicon-germanium substrate. The first substrate 100 may further include a group III element. The group III element may be dopants having a first conductivity type. In other words, the first substrate 100** may have the first conductivity type (e.g., a P-type). For example, the dopants having the first conductivity type may include aluminum (Al), boron (B), indium (In), and/or gallium (Ga), but example embodiments are not limited thereto.

The first substrate 100 may include a plurality of photoelectric conversion regions PD therein. The photoelectric conversion regions PD may be located between the first surface **100*a* and the second surface 100*b* of the first substrate 100. The photoelectric conversion regions PD may be provided in the pixel regions PX of the first substrate 100, respectively. The photoelectric conversion region PD of FIG. 3 may correspond to the photoelectric conversion region PD of FIG. 1**.

The photoelectric conversion region PD may further include a group V element. The group V element may be dopants having a second conductivity type. In other words, the photoelectric conversion region PD may be a dopant region having the second conductivity type. The second conductivity type may be an N-type different from the first conductivity type. The dopants having the second conductivity type may include phosphorus, arsenic, bismuth, and/or antimony, but example embodiments are not limited thereto. The photoelectric conversion region PD may be adjacent to the first surface 100*a* of the first substrate 100. The photoelectric conversion region PD may extend from the first surface 100*a* toward the second surface 100*b*.

An isolation pattern 200 may be provided in the first substrate 100 to define the pixel regions PX. For example, the isolation pattern 200 may be provided between the pixel regions PX adjacent to each other. The isolation pattern 200 may be a pixel isolation pattern. The isolation pattern 200 may be provided in a first trench 201. The first trench 201 may be recessed from the second surface 100*b* toward the first surface 100*a* of the first substrate 100.

The isolation pattern 200 may be a deep trench isolation (DTI) pattern. In some example embodiments, the isolation pattern 200 may penetrate the first substrate 100. In some example embodiments, the isolation pattern 200 may not penetrate the first substrate 100 but may be spaced apart from the first surface 100*a* of the first substrate 100. A width of the isolation pattern 200 adjacent to the second surface 100*b* may be greater than a width of the isolation pattern 200 adjacent to the first surface 100*a*.

The color filters CF may be disposed on the first surface 100*a* of the first substrate 100 and may be disposed on the pixel regions PX, respectively. For example, the color filters CF may be provided at positions corresponding to the photoelectric conversion regions PD, respectively. In some example embodiments, each of the color filters CF may include one of a red filter, a blue filter, and a green filter. The color filters CF may constitute a color filter array. For example, the color filters CF may be two-dimensionally arranged in the form of a Bayer pattern.

In some example embodiments, the color filters CF may further include a white filter. For example, the color filters CF may include the red filters, the blue filters, the green filters and the white filters, which are two-dimensionally arranged.

The fence pattern 300 may be disposed on the isolation pattern 200. For example, the fence pattern 300 may vertically overlap with the isolation pattern 200. The fence pattern 300 may be disposed between two adjacent color filters CF to separate the color filters CF from each other. For example, the color filters CF may be physically and optically separated from each other by the fence pattern 300.

The fence pattern 300 may have a planar shape corresponding to that of the isolation pattern 200. For example, the fence pattern 300 may have a grid shape. The fence pattern 300 may surround each of the pixel regions PX when viewed in a plan view. The fence pattern 300 may surround each of the color filters CF. The fence pattern 300 may include first portions and second portions. The first portions may extend parallel or substantially parallel to the first direction D1 and may be spaced apart from each other in the second direction D2. The second portions may extend parallel or substantially parallel to the second direction D2 and may be spaced apart from each other in the first direction D1. The second portions may intersect the first portions.

The fence pattern 300 may include a first fence pattern 310 and a second fence pattern 320. The first fence pattern 310 may be disposed between the insulating layer 400 and the second fence pattern 320. The first fence pattern 310 may include a conductive material such as a metal and/or a metal nitride. For example, the first fence pattern 310 may include titanium and/or titanium nitride.

The second fence pattern 320 may be disposed on the first fence pattern 310. The second fence pattern 320 may include a different material from that of the first fence pattern 310. The second fence pattern 320 may include an organic material. The second fence pattern 320 may include a low-refractive index material and may have an insulating property.

The insulating layer 400 may be disposed between the first substrate 100 and the color filters CF and between the isolation pattern 200 and the fence pattern 300. The insulating layer 400 may cover the first surface 100*a* of the first substrate 100 and a top surface of the isolation pattern 200. The insulating layer 400 may be a backside insulating layer. The insulating layer 400 may include a bottom anti-reflective coating (BARC) layer. The insulating layer 400 may include a plurality of layers, and the layers of the insulating layer 400 may perform different functions.

In some example embodiments, the insulating layer 400 may include a first insulating layer, a second insulating layer, a third insulating layer, a fourth insulating layer and a fifth insulating layer, which are sequentially stacked on the first surface 100*a* of the first substrate 100. The first insulating layer may cover the first surface 100*a* of the first substrate 100. The first and second insulating layers may be fixed charge layers. Each of the fixed charge layers may be formed of a metal oxide layer or a metal fluoride layer. The metal oxide layer may include insufficient oxygen in terms of a stoichiometric ratio, and the metal fluoride layer may include insufficient fluorine in terms of a stoichiometric ratio.

For example, the first insulating layer may be formed of a metal oxide layer or metal fluoride layer including at least one metal selected from a group consisting of hafnium (Hf), zirconium (Zr), aluminum (Al), tantalum (Ta), titanium (Ti), yttrium (Y), and a lanthanoid, but example embodiments are not limited thereto. The second insulating layer may include the metal oxide layer or metal fluoride layer described as the examples of the first insulating layer. However, the second insulating layer may include a different material from that of the first insulating layer. For example, the first insulating layer may include an aluminum oxide layer, and the second insulating layer may include a hafnium oxide layer.

Each of the first and second insulating layers may have negative fixed charges and may accumulate holes. A dark current and a white spot of the first substrate 100 may be effectively reduced by the first and second insulating layers. A thickness of the second insulating layer may be greater than a thickness of the first insulating layer.

The third insulating layer may be disposed on the second insulating layer. The third insulating layer may include a first silicon-containing material. For example, the first silicon-containing material may include tetraethyl orthosilicate (TEOS) or silicon oxide. The third insulating layer may have a good filling property. For example, the third insulating layer may be formed by, but not limited to, a plasma-enhanced chemical vapor deposition (CVD) method. A thickness of the third insulating layer may be greater than the thickness of the first insulating layer and may be greater than the thickness of the second insulating layer.

The fourth insulating layer may be disposed on the third insulating layer. The fourth insulating layer may include a different material from that of the third insulating layer. The fourth insulating layer may include a second silicon-containing material different from the first silicon-containing material. For example, the fourth insulating layer may include silicon nitride. A thickness of the fourth insulating layer may be greater than the thickness of the third insulating layer.

The fifth insulating layer may be disposed between the fourth insulating layer and the first fence pattern 310 and between the fourth insulating layer and the color filters CF. The fifth insulating layer may be in physical contact with a bottom surface of the first fence pattern 310. The fifth insulating layer may be an adhesive layer or a capping layer. The fifth insulating layer may include a high-k dielectric material or a metal oxide. The fifth insulating layer may include the same material as the second insulating layer. For example, the fifth insulating layer may include hafnium oxide. A thickness of the fifth insulating layer may be greater than the thicknesses of the first and second insulating layers and may be less than the thicknesses of the third and fourth insulating layers.

Unlike the examples described above in detail, the number of the layers of the insulating layer 400 may be variously changed. For example, at least one of the first to fifth insulating layers may be omitted.

The protective layer 470 may cover the insulating layer 400 and the fence pattern 300. The protective layer 470 may include a high-k dielectric material and may have an insulating property. For example, the protective layer 470 may include aluminum oxide or hafnium oxide. Particularly, the protective layer 470 may include aluminum oxide, but example embodiments of the inventive concepts are not limited thereto. The protective layer 470 may protect the photoelectric conversion regions PD of the first substrate 100 from an external environment such as moisture.

The color filters CF may be provided on the protective layer 470. The color filters CF may be spaced apart from each other by the fence pattern 300. A topmost surface of the color filter CF may be higher than a top surface of the fence pattern 300.

The micro lens layer 500 may be provided on the first surface 100*a* of the first substrate 100. For example, the micro lens layer 500 may be provided on the color filters CF. The protective layer 470 may be disposed between the second fence pattern 320 and the micro lens layer 500.

The micro lens layer 500 may include a plurality of convex micro lenses 510. The micro lenses 510 may be provided at positions corresponding to the photoelectric conversion regions PD of the first substrate 100, respectively. For example, the micro lenses 510 may be provided on the color filters CF, respectively, and may correspond to the color filters CF, respectively. The micro lenses 510 may be arranged in the first direction D1 and the second direction D2 to constitute an array when viewed in a plan view. Each of the micro lenses 510 may protrude in a direction away from the first surface 100*a* of the first substrate 100. Each of the micro lenses 510 may have a hemispherical cross section. The micro lenses 510 may concentrate incident light.

The micro lens layer 500 may be transparent to transmit light. The micro lens layer 500 may include an organic material such as a polymer. For example, the micro lens layer 500 may include a photoresist material or a thermosetting resin.

A lens coating layer 530 may be provided on the micro lens layer 500. The lens coating layer 530 may be transparent. The lens coating layer 530 may conformally cover a top surface of the micro lens layer 500. The lens coating layer 530 may protect the micro lens layer 500.

The first substrate 100 may include a ground region GND, a floating diffusion region FD and a dopant region 111, which are adjacent to the second surface 100*b*. The ground region GND, the floating diffusion region FD and the dopant region 111 may be disposed in each of the pixel regions PX. A bottom surface of each of the ground region GND, the floating diffusion region FD and the dopant region 111 may be vertically spaced apart from the photoelectric conversion region PD.

The ground region GND may be heavily doped with dopants to have the first conductivity type (e.g., a P+ type). Each of the floating diffusion region FD and the dopant region 111 may be doped with dopants to have the second conductivity type (e.g., an N-type).

The dopant region 111 may be a dopant region for operation of a transistor. The dopant region 111 may include source/drain regions of at least one of the conversion gain transistor Cx, the reset transistor Rx, the source follower transistor Sx and the selection transistor Ax, described above with reference to FIG. 1.

A device isolation pattern 240 may be provided to be adjacent to the second surface 100*b* of the first substrate 100. The device isolation pattern 240 may define an active region in the pixel region PX. More particularly, in the pixel region PX, the device isolation pattern 240 may define the ground region GND, the floating diffusion region FD, and the dopant region 111.

The device isolation pattern 240 may be provided in a second trench 241, and the second trench 241 may be recessed from the second surface 100*b* of the first substrate 100. The device isolation pattern 240 may be a shallow trench isolation (STI) pattern. A depth of the device isolation pattern 240 may be less than a depth of the isolation pattern 200. A portion of the device isolation pattern 240 may be connected to a sidewall of a first isolation pattern 210 to be described later in FIG. 7. For example, the device isolation pattern 240 may include at least one of silicon oxide, silicon nitride, or silicon oxynitride, but example embodiments are not limited thereto.

A buried gate pattern 700 may be provided on the second surface 100*b* of the first substrate 100. The buried gate pattern 700 may include the transfer gate TG of the transfer transistor Tx described above in FIG. 1. Even though not shown in FIG. 3, at least one additional gate pattern may be provided on each of the pixel regions PX.

The additional gate pattern may function as a gate electrode of at least one of the conversion gain transistor Cx, the source follower transistor Sx, the reset transistor Rx and the selection transistor Ax, described above with reference to FIG. 1. For example, the additional gate pattern may include the conversion gain gate CG, the source follower gate SG, the reset gate RG, or the selection gate AG.

The buried gate pattern 700 may have a buried gate structure. For example, the buried gate pattern 700 may include a first portion 710 and a second portion 720. The first portion 710 of the buried gate pattern 700 may be disposed on the second surface 100*b* of the first substrate 100. The second portion 720 of the buried gate pattern 700 may be buried in the first substrate 100. The second portion 720 of the buried gate pattern 700 may be connected to the first portion 710. Unlike FIG. 3, the buried gate pattern 700 may have a planar gate structure. In some example embodiments, the buried gate pattern 700 may not include the second portion 720. The buried gate pattern 700 may include a metal, a metal silicide, poly-silicon, or any combination thereof. Here, the poly-silicon may include doped poly-silicon.

A gate insulating pattern 740 may be disposed between the buried gate pattern 700 and the first substrate 100. For example, the gate insulating pattern 740 may include a silicon-based insulating material (e.g., silicon oxide, silicon nitride, and/or silicon oxynitride) and/or a high-k dielectric material (e.g., hafnium oxide and/or aluminum oxide), but example embodiments are not limited thereto.

A first pad PAD1 may be provided on the ground region GND. The first pad PAD1 may be provided on the ground regions GND of the pixel regions PX adjacent to each other to electrically connect the ground regions GND to each other. The first pad PAD1 may include the first node N1 described with reference to FIG. 1.

A second pad PAD2 may be provided on the floating diffusion region FD. The second pad PAD2 may be provided on the floating diffusion regions FD of the pixel regions PX adjacent to each other to electrically connect the floating diffusion regions FD to each other. The second pad PAD2 may include the second node N2 described with reference to FIG. 1.

The first and second pads PAD1 and PAD2 may include a metal, a metal silicide, poly-silicon, or any combination thereof. For example, the first and second pads PAD1 and PAD2 may include doped poly-silicon.

The first interconnection layer 800 may be disposed on the second surface 100*b* of the first substrate 100. The first interconnection layer 800 may include a first interlayer insulating layer 810, second interlayer insulating layers 820, and a first conductive structure 830. The first interlayer insulating layer 810 may cover the second surface 100*b* of the first substrate 100 and the buried gate pattern 700. The second interlayer insulating layers 820 may be stacked on the first interlayer insulating layer 810. For example, each of the first and second interlayer insulating layers 810 and 820 may include a silicon-based insulating material such as silicon oxide, silicon nitride, and/or silicon oxynitride, but example embodiments are not limited thereto.

The first conductive structure 830 may be provided in the interlayer insulating layers 810 and 820. The first conductive structure 830 may include contacts, interconnection lines, and vias. The contact may be provided in the first and second interlayer insulating layers 810 and 820 adjacent to the second surface 100*b* so as to be connected to at least one of the buried gate pattern 700, the first and second pads PAD1 and PAD2, and the dopant region 111. The interconnection line of the first conductive structure 830 may be connected to the contact. The via of the first conductive structure 830 may penetrate at least one of the second interlayer insulating layers 820 and may connect the interconnection lines vertically adjacent to each other. The first conductive structure 830 may receive photoelectric signals outputted from the photoelectric conversion regions PD.

Hereinafter, a circuit chip 20 of the image sensor and the optical black region OBR and the pad region PDR of the first substrate 100 will be described in detail. Referring again to FIGS. 2 and 3, the optical black region OBR of the first substrate 100 may be disposed between the pixel array region APS and the pad region PDR. The optical black region OBR may include a first reference pixel region RPX1 and a second reference pixel region RPX2. The first reference pixel region RPX1 may be disposed between the second reference pixel region RPX2 and the pixel array region APS. In the optical black region OBR, the photoelectric conversion region PD may be provided in the first reference pixel region RPX1. The photoelectric conversion region PD of the first reference pixel region RPX1 may have the same or substantially the same planar area and volume as the photoelectric conversion regions PD of the pixel regions PX. The photoelectric conversion region PD may not be provided in the second reference pixel region RPX2. The dopant region 111, the buried gate pattern 700 and the device isolation pattern 240 may be disposed in each of the first and second reference pixel regions RPX1 and RPX2.

The insulating layer 400 may extend from the pixel array region APS onto the pad region PDR via the optical black region OBR. A light blocking layer 950 may be provided on the optical black region OBR. The light blocking layer 950 may be disposed on a top surface of the insulating layer 400. Due to the light blocking layer 950, light may not be incident to the photoelectric conversion region PD of the optical black region OBR. Pixels of the first and second reference pixel regions RPX1 and RPX2 of the optical black region OBR may not output photoelectric signals but may output noise signals. The noise signal may be generated by electrons generated by occurrence of heat or a dark current. Since the light blocking layer 950 does not cover the pixel array region APS, light may be incident to the photoelectric conversion regions PD of the pixel array region APS. The noise signal may be removed from photoelectric signals outputted from the pixel regions PX. For example, the light blocking layer 950 may include a metal such as tungsten, copper, aluminum, or any alloy thereof, but example embodiments are not limited thereto.

In the optical black region OBR of the first substrate 100, a first conductive pattern 911 may be disposed between the insulating layer 400 and the light blocking layer 950. The first conductive pattern 911 may function as a barrier layer or an adhesive layer. The first conductive pattern 911 may include a metal and/or a metal nitride. For example, the first conductive pattern 911 may include a metal such as copper, tungsten, aluminum, titanium, tantalum, or any alloy thereof, but example embodiments are not limited thereto. The first conductive pattern 911 may not extend onto the pixel array region APS of the first substrate 100.

In the optical black region OBR of the first substrate 100, a contact plug 960 may be provided on the first surface 100*a* of the first substrate 100. The contact plug 960 may be disposed on an outermost isolation pattern 200 in the optical black region OBR. A contact trench penetrating the insulating layer 400 may be defined on the first surface 100*a* of the first substrate 100, and the contact plug 960 may be provided in the contact trench.

The contact plug 960 may include a different material from that of the light blocking layer 950. For example, the contact plug 960 may include a metal material such as aluminum. The first conductive pattern 911 may extend between the contact plug 960 and the insulating layer 400 and between the contact plug 960 and the isolation pattern 200.

A protective insulating layer 471 may be provided on the optical black region OBR. The protective insulating layer 471 may be disposed on a top surface of the light blocking layer 950 and a top surface of the contact plug 960. The protective insulating layer 471 may include the same or substantially the same material as the protective layer 470 and may be connected to the protective layer 470. The protective insulating layer 471 and the protective layer 470 may be formed in one body. In some example embodiments, the protective insulating layer 471 may be formed by a different process from a process of forming the protective layer 470 and may be spaced apart from the protective layer 470. The protective insulating layer 471 may include a high-k dielectric material (e.g., aluminum oxide and/or hafnium oxide).

A filtering layer 550 may be disposed on the first surface 100*a* of the optical black region OBR. The filtering layer 550 may cover a top surface of the protective insulating layer 471. The filtering layer 550 may block light having a different wavelength from those of the color filters CF. For example, the filtering layer 550 may block infrared light. The filtering layer 550 may include, but is not limited to, a blue color filter.

An organic layer 501 may be provided on a top surface of the filtering layer 550. The organic layer 501 may be transparent. A top surface of the organic layer 501 may be substantially flat. For example, the organic layer 501 may include a polymer. The organic layer 501 may have an insulating property. In some example embodiments, unlike FIG. 3, the organic layer 501 may be connected to the micro lens layer 500. The organic layer 501 may include the same material as the micro lens layer 500.

A coating layer 531 may be provided on the organic layer 501. The coating layer 531 may conformally cover a top surface of the organic layer 501. The coating layer 531 may include an insulating material and may be transparent. The coating layer 531 may include the same material as the lens coating layer 530.

The image sensor may further include a circuit chip 20. The circuit chip 20 may be stacked on the sensor chip 10. The circuit chip 20 may include a second interconnection layer 1800 and a second substrate 1000. The second interconnection layer 1800 may be disposed between the first interconnection layer 800 and the second substrate 1000. Integrated circuits 1700 may be disposed on a top surface of the second substrate 1000 and/or in the second substrate 1000. The integrated circuits 1700 may include logic circuits, memory circuits, or a combination thereof. For example, the integrated circuits 1700 may include transistors.

The second interconnection layer 1800 may include third interlayer insulating layers 1820 and second conductive structures 1830. The second conductive structures 1830 may be provided between the third interlayer insulating layers 1820 and/or in the third interlayer insulating layers 1820. The second conductive structures 1830 may be electrically connected to the integrated circuits 1700. The second interconnection layer 1800 may further include a via pattern, and the via pattern may be connected to the second conductive structures 1830 in the third interlayer insulating layers 1820.

The external connection pad 600 may be provided on the pad region PDR of the first substrate 100. The external connection pad 600 may be adjacent to the first surface 100*a* of the first substrate 100. The external connection pad 600 may be buried in the first substrate 100. For example, a pad trench 990 may be defined in the first surface 100*a* of the first substrate 100 of the pad region PDR, and the external connection pad 600 may be provided in the pad trench 990. The external connection pad 600 may include a metal such as aluminum, copper, tungsten, titanium, tantalum, or any alloy thereof, but example embodiments are not limited thereto. In a mounting process of the image sensor, a bonding wire may be formed on the external connection pad 600 and may be connected to the external connection pad 600. The external connection pad 600 may be electrically connected to an external device through the bonding wire.

A first through-hole 901 may be defined to be adjacent to a first side of the external connection pad 600. The first through-hole 901 may be provided between the external connection pad 600 and the contact plug 960. The first through-hole 901 may penetrate the insulating layer 400, the first substrate 100, and the first interconnection layer 800. The first through-hole 901 may further penetrate at least a portion of the second interconnection layer 1800. The first through-hole 901 may have a first bottom surface and a second bottom surface. The first bottom surface of the first through-hole 901 may expose the first conductive structure 830. The second bottom surface of the first through-hole 901 may be disposed at a lower level than the first bottom surface. The second bottom surface of the first through-hole 901 may expose the second conductive structure 1830.

The first conductive pattern 911 may extend from the optical black region OBR onto the pad region PDR. The first conductive pattern 911 may cover an inner surface of the first through-hole 901. The first conductive pattern 911 in the first through-hole 901 may be in contact with a top surface of the first conductive structure 830. Thus, the first conductive structure 830 may be electrically connected to a second isolation pattern 220 to be described later in FIG. 7 through the first conductive pattern 911.

The first conductive pattern 911 in the first through-hole 901 may also be connected to a top surface of the second conductive structure 1830. The second conductive structure 1830 may be electrically connected to the first conductive structure 830 and the second isolation pattern 220 through the first conductive pattern 911.

A first filling pattern 921 may be provided in the first through-hole 901 to fill the first through-hole 901. The first filling pattern 921 may include a low-refractive index material and may have an insulating property. The first filling pattern 921 may include the same or substantially the same material as the second fence pattern 320. A top surface of the first filling pattern 921 may have a recess. For example, a center of the top surface of the first filling pattern 921 may be lower than an edge of the top surface of the first filling pattern 921.

A first capping pattern 931 may be disposed on the top surface of the first filling pattern 921 to fill the recess. A top surface of the first capping pattern 931 may be substantially flat. The first capping pattern 931 may include an insulating polymer such as a photoresist material.

A second through-hole 902 may be defined to be adjacent to a second side of the external connection pad 600. The second through-hole 902 may penetrate the insulating layer 400, the first substrate 100, and the first interconnection layer 800. The second through-hole 902 may penetrate a portion of the second interconnection layer 1800 to expose the second conductive structure 1830.

A second conductive pattern 912 may be provided on the pad region PDR. The second conductive pattern 912 may be provided in the second through-hole 902 to conformally cover an inner sidewall and a bottom surface of the second through-hole 902. The second conductive pattern 912 may be electrically connected to the second conductive structure 1830.

The second conductive pattern 912 may extend between the external connection pad 600 and an inner surface of the pad trench 990 to cover a bottom surface and a sidewall of the external connection pad 600. When the image sensor operates, the integrated circuits 1700 of the circuit chip 20 may transmit/receive electrical signals through the second conductive structure 1830, the second conductive pattern 912 and the external connection pad 600.

A second filling pattern 922 may be provided in the second through-hole 902 to fill the second through-hole 902. The second filling pattern 922 may include a low-refractive index material and may have an insulating property. For example, the second filling pattern 922 may include the same or substantially the same material as the second fence pattern 320. A top surface of the second filling pattern 922 may have a recess.

A second capping pattern 932 may be disposed on the top surface of the second filling pattern 922 to fill the recess. A top surface of the second capping pattern 932 may be substantially flat. The second capping pattern 932 may include an insulating polymer such as a photoresist material.

The protective insulating layer 471 may extend from the optical black region OBR onto the pad region PDR. The protective insulating layer 471 may be provided on the top surface of the insulating layer 400 and may extend into the first through-hole 901 and the second through-hole 902. The protective insulating layer 471 may be disposed between the first conductive pattern 911 and the first filling pattern 921 in the first through-hole 901. The protective insulating layer 471 may be disposed between the second conductive pattern 912 and the second filling pattern 922 in the second through-hole 902. The protective insulating layer 471 may expose the external connection pad 600.

Figure 4:
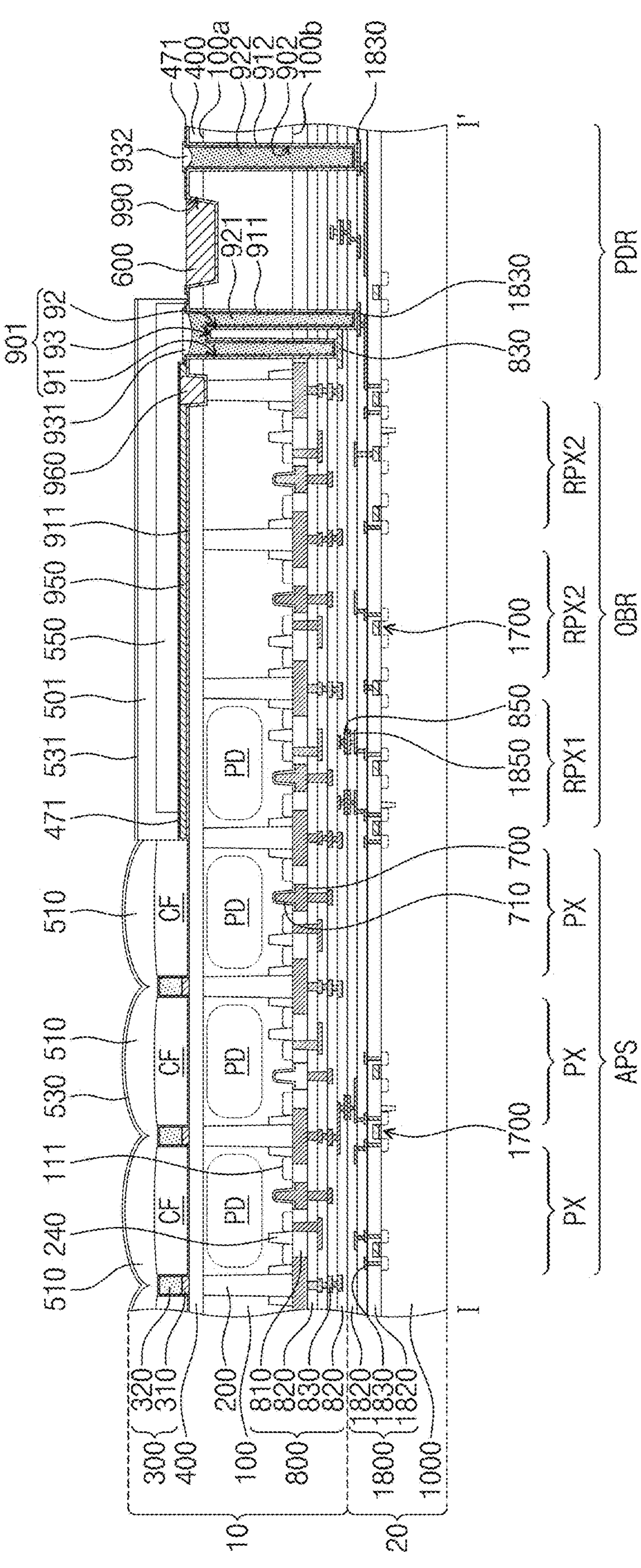
FIG. 4 is a cross-sectional view taken along the line I-I' of FIG. 2 to illustrate an image sensor according to some example embodiments of the inventive concepts.

FIG. 4 is a cross-sectional view taken along the line I-I' of FIG. 2 to illustrate an image sensor according to some example embodiments of the inventive concepts. In the example embodiments, the descriptions to the same technical features as mentioned above with reference to FIGS. 1 to 3 will be omitted and differences between the example embodiments and the above embodiments of FIGS. 1 to 3 will be mainly described, for the purpose of ease and convenience in explanation.

Referring to FIGS. 2 and 4, an image sensor may include a sensor chip 10 and a circuit chip 20. The sensor chip 10 may include a first connection pad 850. The first connection pad 850 may be exposed at a bottom surface of the sensor chip 10. The first connection pad 850 may be disposed in a lowermost second interlayer insulating layer 820. The first connection pad 850 may be electrically connected to the first conductive structure 830. The first connection pad 850 may include a conductive material such as a metal. For some example embodiments, the first connection pad 850 may include copper. For some example embodiments, the first connection pad 850 may include aluminum, tungsten, titanium, and/or any alloy thereof.

The circuit chip 20 may include a second connection pad 1850. The second connection pad 1850 may be exposed at a top surface of the circuit chip 20. The second connection pad 1850 may be disposed in an uppermost third interlayer insulating layer 1820. The second connection pad 1850 may be electrically connected to the integrated circuits 1700. The second connection pad 1850 may include a conductive material such as a metal. For some examples, the second connection pad 1850 may include copper. For some example embodiments, the second connection pad 1850 may include aluminum, tungsten, titanium, and/or any alloy thereof.

The circuit chip 20 may be connected to the sensor chip 10 by direct bonding. For example, the first connection pad 850 and the second connection pad 1850 may be vertically aligned with each other, and the first connection pad 850 and the second connection pad 1850 may be in contact with each other. Thus, the second connection pad 1850 may be bonded directly to the first connection pad 850. As a result, the integrated circuits 1700 of the circuit chip 20 may be electrically connected to the transistors and/or the external connection pad 600 of the sensor chip 10 through the first and second connection pads 850 and 1850.

The second interlayer insulating layer 820 may be adhered directly to the third interlayer insulating layer 1820. In some example embodiments, chemical bonds may be formed between the second interlayer insulating layer 820 and the third interlayer insulating layer 1820.

A first through-hole 901 may include a first through-hole portion 91, a second through-hole portion 92, and a third through-hole portion 93. The first through-hole portion 91 may penetrate the insulating layer 400, the first substrate 100, and the first interconnection layer 800 and may have a first bottom surface. The second through-hole portion 92 may penetrate the insulating layer 400, the first substrate 100, and the first interconnection layer 800 and may extend into an upper portion of the second interconnection layer 1800. The second through-hole portion 92 may have a second bottom surface exposing a top surface of the second conductive structure 1830. A sidewall of the second through-hole portion 92 may be spaced apart from a sidewall of the first through-hole portion 91. The third through-hole portion 93 may be provided between an upper portion of the first through-hole portion 91 and an upper portion of the second through-hole portion 92 and may be connected to the upper portion of the first through-hole portion 91 and the upper portion of the second through-hole portion 92. The first conductive pattern 911, the protective insulating layer 471 and the first filling pattern 921 may be provided in the first through-hole 901. The first conductive pattern 911 may cover inner surfaces of the first through-hole portion 91, the second through-hole portion 92 and the third through-hole portion 93.

Figure 5:
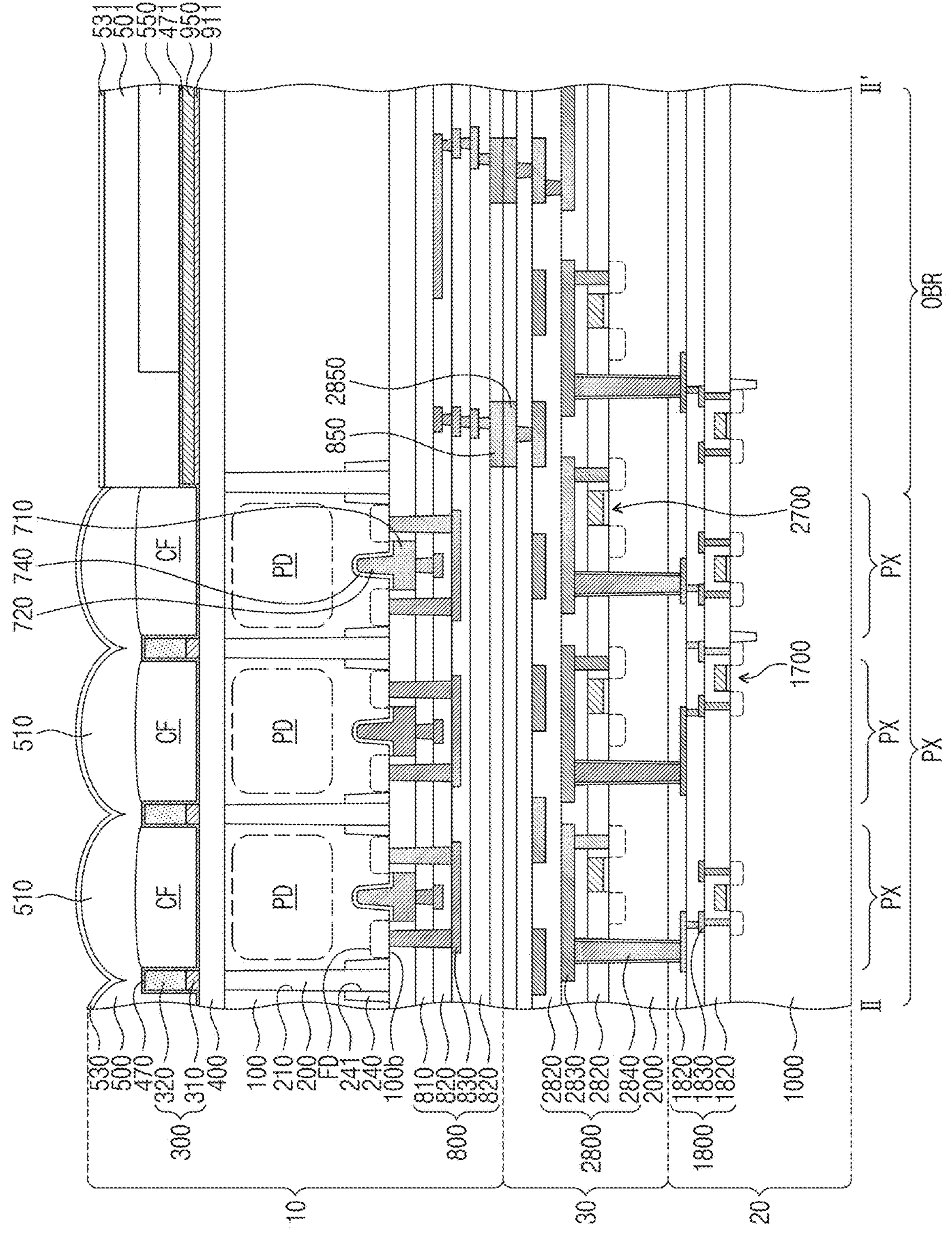
FIG. 5 is a cross-sectional view taken along a line II-II' of FIG. 2 to illustrate an image sensor according to some example embodiments of the inventive concepts.

FIG. 5 is a cross-sectional view taken along a line II-II' of FIG. 2 to illustrate an image sensor according to some example embodiments of the inventive concepts. In the example embodiments, the descriptions to the same technical features as mentioned above with reference to FIGS. 1 to 4 will be omitted and differences between the example embodiments and the above embodiments of FIGS. 1 to 4 will be mainly described, for the purpose of ease and convenience in explanation.

Referring to FIGS. 2 and 5, an image sensor may further include an intermediate chip 30 disposed between the sensor chip 10 and the circuit chip 20. The intermediate chip 30 may include a third interconnection layer 2800 and a third substrate 2000. The third interconnection layer 2800 may be disposed between the first interconnection layer 800 and the third substrate 2000. The second interconnection layer 1800 of the circuit chip 20 may be provided under the third substrate 2000.

Driving transistors 2700 may be provided on a top surface of the third substrate 2000. The driving transistors 2700 may include the conversion gain transistor Cx, the reset transistor Rx, the source follower transistor Sx and the selection transistor Ax, described with reference to FIG. 1. In other words, according to some example embodiments, the photoelectric conversion region PD, the transfer transistor Tx and the floating diffusion region FD of FIG. 1 may be provided in or on the first substrate 100 of the sensor chip 10. The conversion gain transistor Cx, the reset transistor Rx, the source follower transistor Sx and the selection transistor Ax of FIG. 1 may be provided on the third substrate 2000 of the intermediate chip 30.

The third interconnection layer 2800 may include fourth interlayer insulating layers 2820 and third conductive structures 2830. The third conductive structures 2830 may be provided between the fourth interlayer insulating layers 2820 and/or in the fourth interlayer insulating layers 2820. The third conductive structures 2830 may be electrically connected to the driving transistors 2700. The third conductive structures 2830 may include contacts, interconnection lines, and vias.

The sensor chip 10 may include the first connection pad 850. The first connection pad 850 may be exposed at the bottom surface of the sensor chip 10. The first connection pad 850 may be disposed in the lowermost second interlayer insulating layer 820. The first connection pad 850 may be electrically connected to the first conductive structure 830.

The intermediate chip 30 may include a third connection pad 2850. The third connection pad 2850 may be exposed at a top surface of the intermediate chip 30. The third connection pad 2850 may be disposed in an uppermost fourth interlayer insulating layer 2820. The third connection pad 2850 may be electrically connected to the driving transistors 2700. The third connection pad 2850 may include a conductive material such as a metal. For some example embodiments, the third connection pad 2850 may include copper. For some example embodiments, the third connection pad 2850 may include aluminum, tungsten, titanium, and/or any alloy thereof.

The intermediate chip 30 may be connected to the sensor chip 10 by direct bonding. For example, the first connection pad 850 and the third connection pad 2850 may be vertically aligned with each other, and the first connection pad 850 and the third connection pad 2850 may be in contact with each other. Thus, the third connection pad 2850 may be bonded directly to the first connection pad 850. As a result, the driving transistors 2700 of the intermediate chip 30 may be electrically connected to the floating diffusion regions FD of the sensor chip 10 through the first and third connection pads 850 and 2850.

The second interlayer insulating layer 820 may be adhered directly to the fourth interlayer insulating layer 2820. In some example embodiments, chemical bonds may be formed between the second interlayer insulating layer 820 and the fourth interlayer insulating layer 2820.

The intermediate chip 30 may further include through-vias 2840 penetrating the third substrate 2000. Each of the through-vias 2840 may electrically connect the third interconnection layer 2800 to the second interconnection layer 1800. In other words, the intermediate chip 30 and the circuit chip 20 may be electrically connected to each other through the through-vias 2840.

Figure 6:
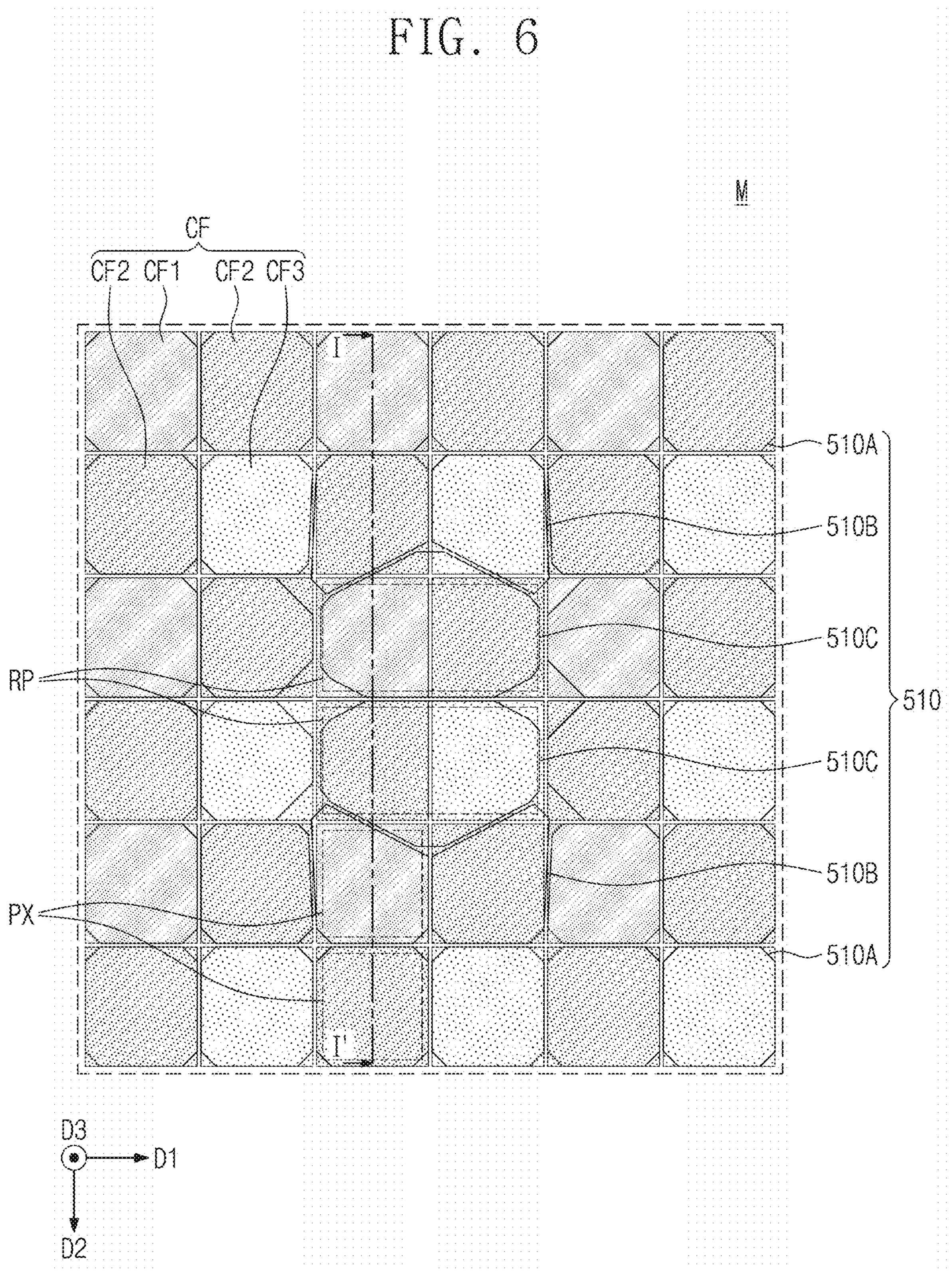
FIG. 6 is an enlarged plan view of a region 'M' of FIG. 2 to illustrate color filters and micro lenses according to some example embodiments of the inventive concepts.
Figure 7:
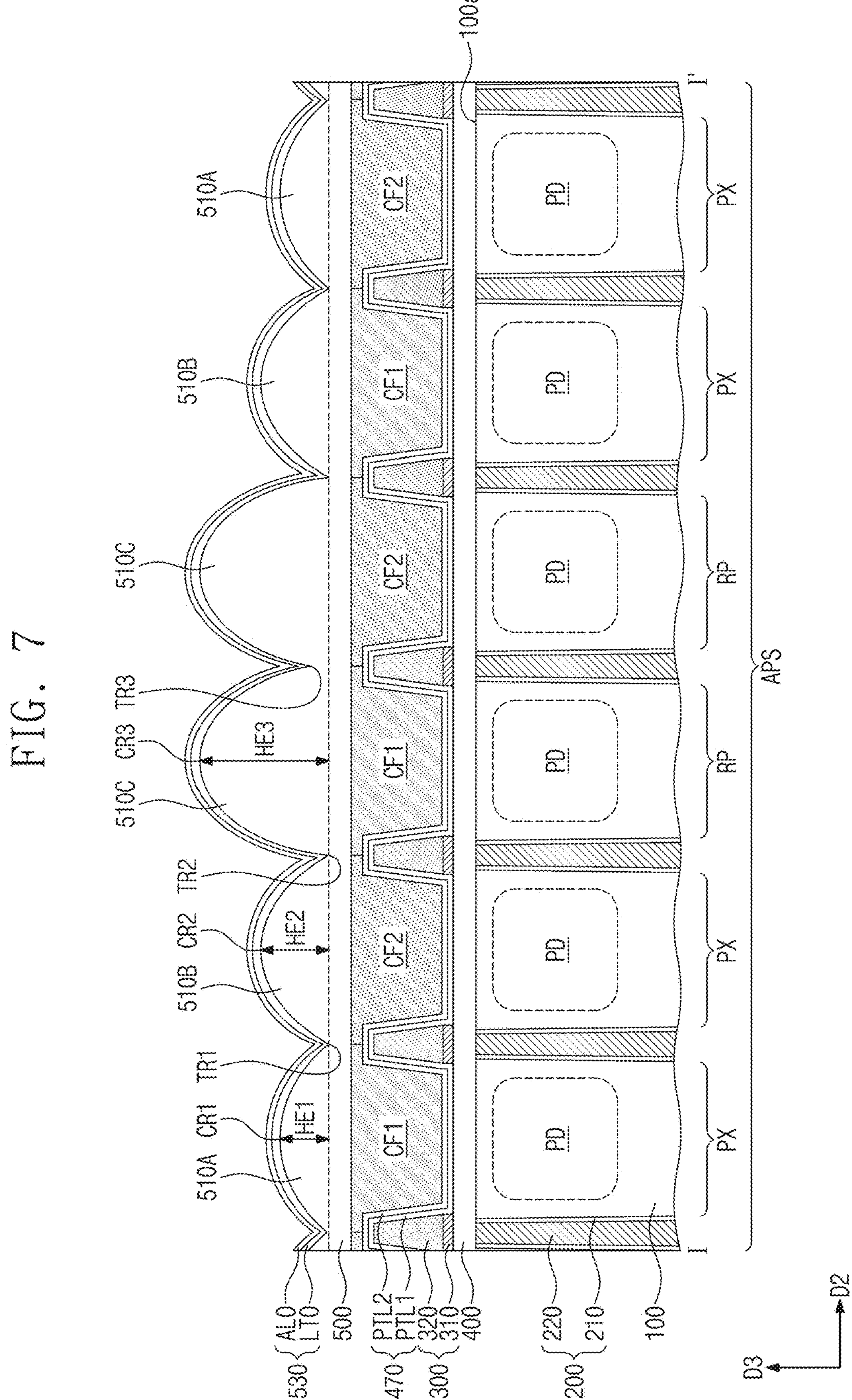
FIG. 7 is a cross-sectional view taken along a line I-I' of FIG. 6.

FIG. 6 is an enlarged plan view of a region 'M' of FIG. 2 to illustrate color filters and micro lenses according to some example embodiments of the inventive concepts. FIG. 7 is a cross-sectional view taken along a line I-I' of FIG. 6. In the example embodiments, the descriptions to the same technical features as mentioned above with reference to FIGS. 1 to 5 will be omitted and differences between the example embodiments and the above embodiments of FIGS. 1 to 5 will be mainly described, for the purpose of ease and convenience in explanation.

Referring to FIGS. 6 and 7, an image sensor may include a first substrate 100. The image sensor may further include an insulating layer 400, color filters CF, a fence pattern 300 and a micro lens layer 500, which are provided on the first surface 100*a* of the first substrate 100. In the example embodiments, illustration of components under the first substrate 100 is omitted, and the components under the first substrate 100 may be the same or substantially the same as described above with reference to FIGS. 3 to 5.

The pixel array region APS of the first substrate 100 may include focus pixel regions RP and pixel regions PX. The pixel regions PX may be two-dimensionally arranged to surround a pair of the focus pixel regions RP when viewed in a plan view (see FIG. 6).

An isolation pattern 200 having a grid shape may be provided in the first substrate 100. The isolation pattern 200 may define the focus pixel regions RP and the pixel regions PX. In some example embodiments, the isolation pattern 200 may include a first isolation pattern 210 and a second isolation pattern 220.

The first isolation pattern 210 may be disposed between the second isolation pattern 220 and the first substrate 100. For example, the first isolation pattern 210 may include an insulating material such as silicon oxide. The second isolation pattern 220 may include a conductive material such as doped poly-silicon or a metal. For example, as described above with reference to FIG. 3, the second isolation pattern 220 adjacent to the pad region PDR may be electrically connected to the first conductive pattern 911.

According to some example embodiments, the focus pixel region RP may include a pair of photoelectric conversion regions PD and the isolation pattern 200 between the pair of photoelectric conversion regions PD. The focus pixel region RP may perform a function of correcting a focus of an image outputted from the pixel regions PX but may not output an image of an object (or subject). For example, the photoelectric conversion regions PD in the focus pixel region RP may be spaced apart from each other, and thus lights incident to the photoelectric conversion regions PD in the focus pixel region RP may have different phases. A focus of an obtained image of an object may be corrected using a phase difference between images obtained from the photoelectric conversion regions PD.

More particularly, a photoelectric signal outputted from the focus pixel region RP may be compared with photoelectric signals outputted from the pixel regions PX to correct a focus of an image outputted from the pixel regions PX. Thus, the image sensor may obtain 3D depth information of an object.

In some example embodiments, even though not shown in the drawings, the focus pixel region RP may include three or more photoelectric conversion regions PD. In other words, the number of the photoelectric conversion regions PD disposed in the focus pixel region RP may be variously changed.

In some example embodiments, the color filter CF on the focus pixel region RP may include a red filter, a green filter, or a blue filter. For some example embodiments, the color filter CF on the focus pixel region RP may include a white color filter or a transparent filter.

Referring again to FIG. 6, in the example embodiments, four color filters CF adjacent to each other may include a first color filter CF1, a pair of second color filters CF2, and a third color filter CF3. For example, the first color filter CF1 may be a red filter, the second color filter CF2 may be a green filter, and the third color filter CF3 may be a blue filter.

The first color filter CF1, the pair of second color filters CF2 and the third color filter CF3 may constitute a color filter array. For example, the first color filter CF1, the pair of second color filters CF2 and the third color filter CF3 may be two-dimensionally arranged in the form of a Bayer pattern.

Referring again to FIG. 7, the fence pattern 300 may be provided between the first and second color filters CF1 and CF2 adjacent to each other. A protective layer 470 may be disposed between the fence pattern 300 and the first and second color filters CF1 and CF2.

The protective layer 470 according to some example embodiments of the inventive concepts may include a first protective layer PTL1 and a second protective layer PTL2, which are sequentially stacked. The first protective layer PTL1 may include a high-k dielectric material such as aluminum oxide or hafnium oxide. The second protective layer PTL2 may include silicon oxide. For example, the second protective layer PTL2 may be formed using an atomic layer deposition (ALD) process. The second protective layer PTL2 may be densely and conformally formed by the ALD process. A thickness of the second protective layer PTL2 may be substantially equal to or less than a thickness of the first protective layer PTL1.

A top surface of the color filter CF may be higher than an uppermost portion of the second protective layer PTL2. In other words, the color filters CF may completely cover the second protective layer PTL2. The fence pattern 300 may be spaced apart from the color filter CF by the first and second protective layers PTL1 and PTL2.

As will be described in a manufacturing method to be mentioned later, the first to third color filters CF1, CF2 and CF3 may be formed in consecutive order. For example, the second color filters CF2 corresponding to the green filters may be formed, and then, the first color filters CF1 may be formed. Before the formation of the first color filters CF1, an etching process for removing a pigment of the second color filter CF2 may be performed.

If the second protective layer PTL2 is omitted in a comparative example, a pigment on the first protective layer PTL1 formed of a metal oxide may not be easily removed but may cause failure. However, according to some example embodiments of the inventive concepts, the second protective layer PTL2 formed of silicon oxide may be provided on the first protective layer PTL1, and thus the pigment on the second protective layer PTL2 may be easily removed. As a result, a defect of the color filter CF may be prevented.

The second fence pattern 320 may include a low-refractive index material formed by a process (e.g., a spin coating process), and the low-refractive index material may be porous. Since the second fence pattern 320 is porous, incident light may be transmitted through the second fence pattern 320 to cause a cross-talk phenomenon between the pixels PX and to reduce sensitivity.

Meanwhile, the second protective layer PTL2 according to some example embodiments may be a dense layer formed by the ALD process and may be provided on the second fence pattern 320 to prevent incident light from being transmitted through the second fence pattern 320. Thus, according to the inventive concepts, the cross-talk phenomenon between the pixels PX may be prevented, and the sensitivity of the image sensor may be improved.

The micro lens layer 500 including micro lenses 510 may be provided on the color filters CF. A lens coating layer 530 may be provided on the micro lenses 510. The micro lenses 510 may be provided on the color filters CF, respectively. The micro lenses 510 may include first micro lenses 510A, second micro lenses 510B, and third micro lenses 510C.

The first and second micro lenses 510A and 510B may be provided on the pixel regions PX, respectively. The third micro lenses 510C may be provided on the focus pixel regions RP, respectively. The third micro lens 510C may be an auto-focus lens.

Referring again to FIG. 6, a pair of the third micro lenses 510C may be provided on a pair of the focus pixel regions RP, respectively. The pair of third micro lenses 510C may be adjacent to each other in the second direction D2. Twelve second micro lenses 510B may two-dimensionally surround the pair of third micro lenses 510C. Twenty first micro lenses 510A may two-dimensionally surround the second micro lenses 510B.

The first to third micro lenses 510A, 510B and 510C may have different areas when viewed in a plan view. For example, the area of the first micro lens 510A may be greater than the area of the second micro lens 510B. The area of the third micro lens 510C may be greater than the area of the first micro lens 510A. The area of each of the second micro lenses 510B around the third micro lens 510C may be reduced due to the third micro lens 510C having the largest size and corresponding to the auto-focus lens. Thus, the area of the second micro lens 510B may be less than the area of the first micro lens 510A.

Referring again to FIG. 7, a first trough TR1 may be defined between the first micro lens 510A and the second micro lens 510B adjacent thereto. The first micro lens 510A may have a first crest CR1 defined at its uppermost portion. The second micro lens 510B may have a second crest CR2 defined at its uppermost portion.

A second trough TR2 may be defined between the second micro lens 510B and the third micro lens 510C adjacent thereto. A third trough TR3 may be defined between the pair of third micro lenses 510C adjacent to each other. The third micro lens 510C may have a third crest CR3 defined at its uppermost portion.

In some example embodiments, the third crest CR3 may be higher than the second crest CR2. The second crest CR2 may be higher than the first crest CR1. The third trough TR3 may be higher than the second trough TR2. The third trough TR3 may be higher than the first trough TR1. The second trough TR2 may be higher than the first trough TR1 or may be located at the same level as the first trough TR1.

A level difference between the first trough TR1 and the first crest CR1 may be defined as a first height HE1 of the first micro lens 510A. A level difference between the first trough TR1 and the second crest CR2 may be defined as a second height HE2 of the second micro lens 510B. A level difference between the first trough TR1 and the third crest CR3 may be defined as a third height HE3 of the third micro lens 510C. The third height HE3 may be greater than the second height HE2. The second height HE2 may be greater than the first height HE1.

The micro lenses according to some example embodiments may have different heights. The amount of light received by the micro lens may increase as the height of the micro lens increases, and the amount of light received by the micro lens may decrease as the height of the micro lens decreases.

More particularly, the third micro lens 510C which is the auto-focus lens may have the greatest height HE1 and the greatest area among the micro lenses 510. Thus, the amount of light received by the third micro lens 510C may be greatest among the micro lenses 510.

The amount of light received by the second micro lens 510B adjacent directly to the third micro lens 510C may be reduced by the third micro lens 510C. However, according to some example embodiments of the inventive concepts, the second height HE2 of the second micro lens 510B may be greater than the first height HE1 of the first micro lens 510A, and thus the amount of light received by the second micro lens 510B, which is reduced by the third micro lens 510C, may be compensated.

As a result, according to some example embodiments, a difference between the amount of a photoelectric signal in the pixel region PX adjacent to the focus pixel region RP and the amount of a photoelectric signal in the pixel region PX spaced apart from the focus pixel region RP may be compensated by physically adjusting the heights of the micro lenses 510.

The lens coating layer 530 according to some embodiments of the inventive concepts may include a first coating layer LTO and a second coating layer ALO. For example, the first coating layer LTO may include a silicon oxide layer formed by a PECVD process. The second coating layer ALO may include a silicon oxide layer formed by an ALD process. In other words, the first coating layer LTO and the second coating layer ALO may include the same silicon-based insulating material.

The first coating layer LTO may be formed by the PECVD process and thus may be a porous layer having a small density. The first coating layer LTO may have the greatest thickness on the first to third crests CR1 to CR3. The first coating layer LTO may have the smallest thickness on the first to third troughs TR1 to TR3. In other words, the thickness of the first coating layer LTO may be non-uniform.

Meanwhile, the second coating layer ALO may be formed by the ALD process and thus may be denser than the first coating layer LTO. The second coating layer ALO may be conformally formed by the ALD process and thus may have a uniform or substantially uniform thickness. For example, a thickness of the second coating layer ALO on the first to third crests CR1 to CR3 may be substantially equal to a thickness of the second coating layer ALO on the first to third troughs TR1 to TR3. The second coating layer ALO may supplement a phenomenon that the first coating layer LTO does not sufficiently cover the first to third troughs TR1 to TR3.

Figure 8:
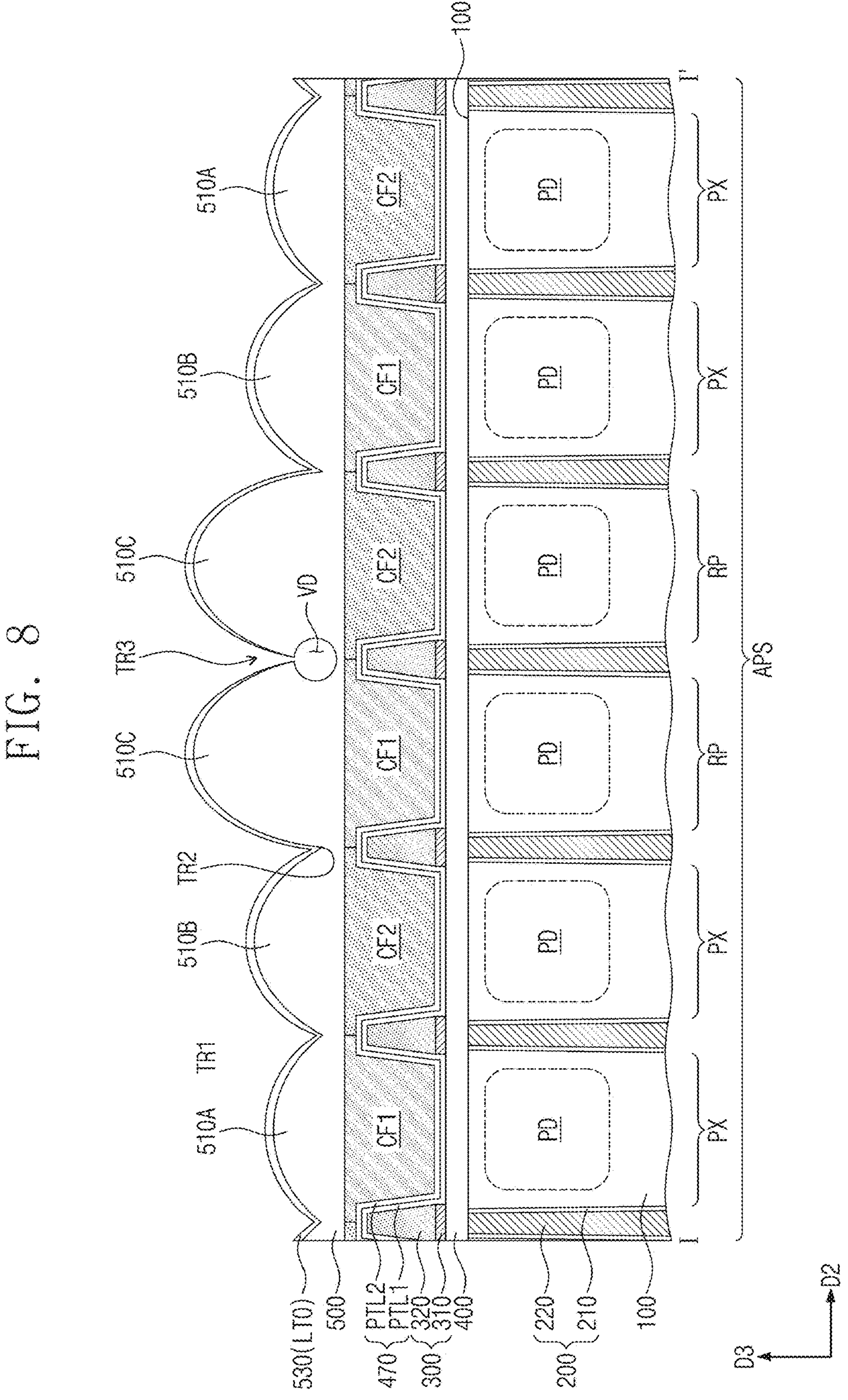
FIG. 8 is a cross-sectional view corresponding to the line I-I' of FIG. 6 to illustrate an image sensor according to another example embodiment.

FIG. 8 is a cross-sectional view corresponding to the line I-I' of FIG. 6 to illustrate an image sensor according to an example embodiment. Referring to FIG. 8, a lens coating layer 530 may be formed of only the first coating layer LTO. In other words, the second coating layer ALO may be omitted from the lens coating layer 530. A void VD may be formed in the micro lens layer 500 through the third trough TR3. Since the third trough TR3 is deeper than the first and second troughs TR1 and TR2, the lens coating layer 530 may not be sufficiently formed in the third trough TR3. Thus, the micro lens layer 500 may be exposed through the third trough TR3 to cause process failure (e.g., the void VD).

On the contrary, according to some example embodiments of the inventive concepts of FIG. 7, since the lens coating layer 530 includes the second coating layer ALO formed by the ALD process as well as the first coating layer LTO, the micro lens layer 500 may not be exposed through the third trough TR3. Thus, according to the example embodiments, it is possible to inhibit or prevent process failure (e.g., the void VD) which may occur in the micro lens layer 500. As a result, according to the example embodiments, reliability and performance of the image sensor may be improved.

FIGS. 9 to 15 are cross-sectional views corresponding to the line I-I' of FIG. 6 to illustrate a method of manufacturing an image sensor according to some example embodiments of the inventive concepts.

Figure 9:
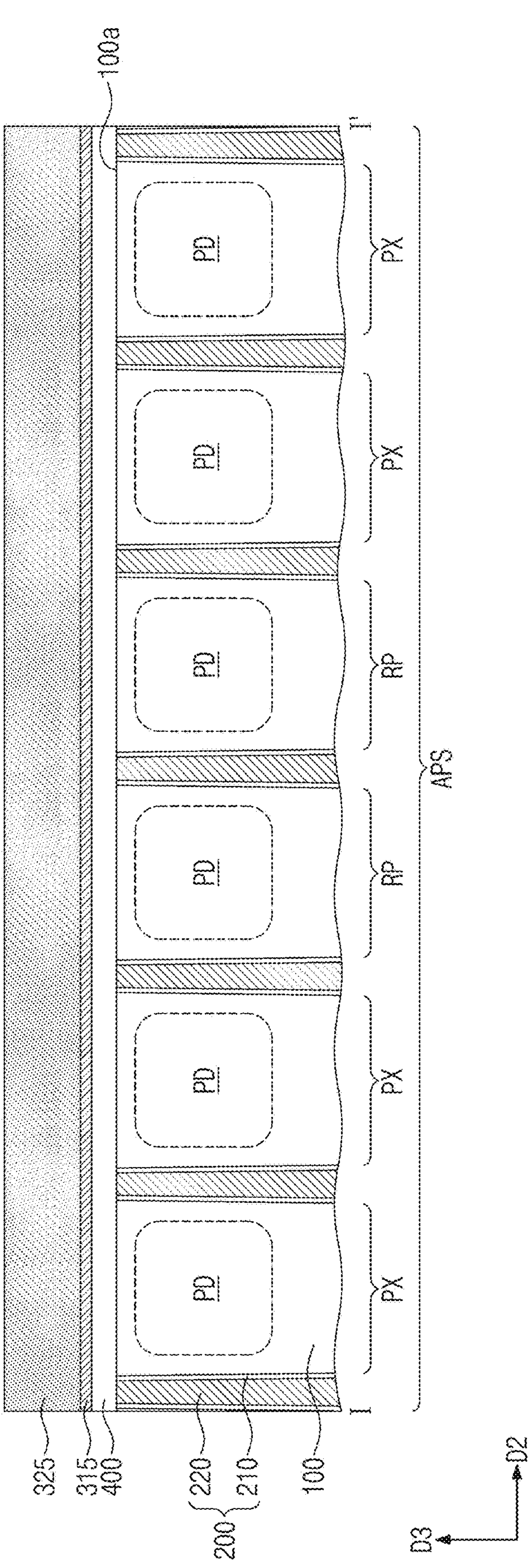

Referring to FIGS. 6 and 9, a first substrate 100 including focus pixel regions RP and pixel regions PX may be provided. Particularly, an isolation pattern 200 defining the focus pixel regions RP and the pixel regions PX may be formed in the first substrate 100.

A photoelectric conversion region PD may be formed in each of the focus pixel regions RP and the pixel regions PX. The photoelectric conversion region PD may be formed by a dopant doping process using an ion implantation process.

An insulating layer 400 may be formed on a planarized first surface 100*a* of the first substrate 100. In some example embodiments, the formation of the insulating layer 400 may include sequentially stacking first to fifth insulating layers on the first surface 100*a*. The first insulating layer may be formed to directly cover the first surface 100*a*. The first and second insulating layers may be fixed charge layers. The third insulating layer may be formed of a silicon oxide layer, and the fourth insulating layer may be formed of a silicon nitride layer. The fifth insulating layer may be an adhesive layer or a capping layer.

A light blocking layer 315 and a low refractive layer 325 may be sequentially formed on the insulating layer 400. The light blocking layer 315 may be formed of a conductive material such as a metal and/or a metal nitride. The low refractive layer 325 may be formed of a low-refractive index material having a refractive index in a range of about 1.1 to about 1.3. The low refractive layer 325 may include an organic material and an oxide. An oxide concentration in the low refractive layer 325 may be controlled to adjust the refractive index of the low refractive layer 325. The formation of the low refractive layer 325 may include spin-coating a composite including the organic material and a solvent on the light blocking layer 315, and performing a soft bake process or a drying process to remove the solvent.

Figure 10:
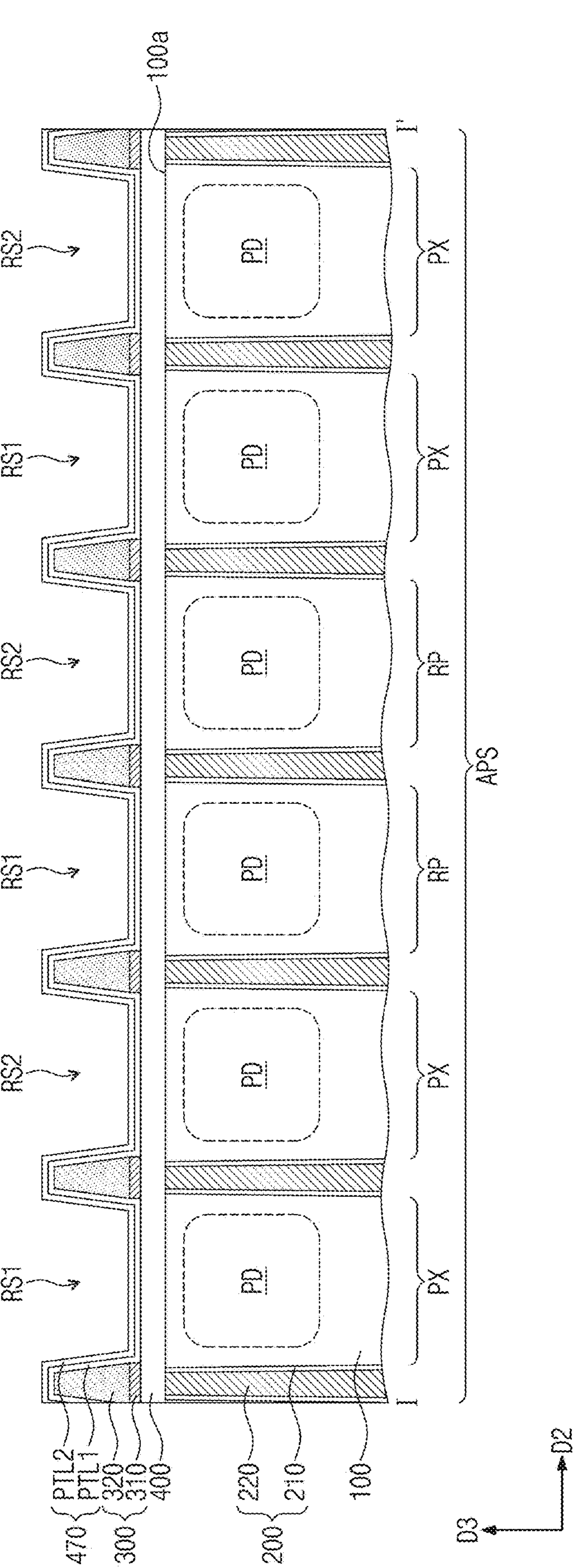

Referring to FIGS. 6 and 10, the low refractive layer 325 and the light blocking layer 315 may be patterned to form a second fence pattern 320 and a first fence pattern 310, respectively. The first and second fence patterns 310 and 320 may constitute a fence pattern 300 defining regions in which color filters will be formed. The fence pattern 300 may have a grid structure and may vertically overlap with the isolation pattern 200.

In some example embodiments, first and second recesses RS1 and RS2 may be defined by the fence pattern 300. The first and second recesses RS1 and RS2 may be alternately arranged in the second direction D2.

A protective layer 470 may be formed on the fence pattern 300 and the insulating layer 400. The formation of the protective layer 470 may include sequentially forming a first protective layer PTL1 and a second protective layer PTL2.

The first protective layer PTL1 may be formed using a CVD process or an ALD process. The first protective layer PTL1 may be formed of a high-k dielectric material such as aluminum oxide or hafnium oxide. For example, the first protective layer PTL1 may be formed with a thickness in a range of 100 Å to 200 Å.

The second protective layer PTL2 may be formed on the first protective layer PTL1 by an ALD process. For example, the second protective layer PTL2 may be formed of silicon oxide. The second protective layer PTL2 may be formed with a thickness in a range of 50 Å to 150 Å.

Figure 11:
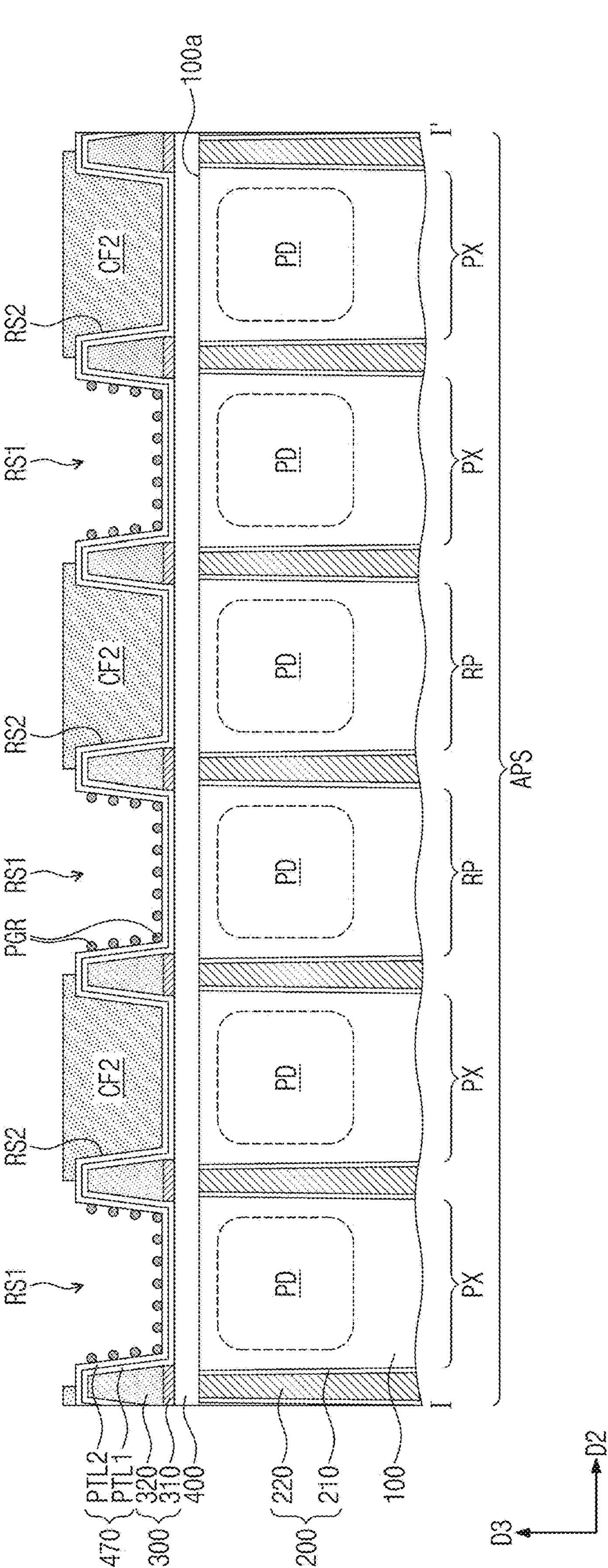

Referring to FIGS. 6 and 11, second color filters CF2 filling the second recesses RS2 may be formed. The second color filters CF2 may be formed directly on the second protective layer PTL2.

More particularly, the formation of the second color filters CF2 may include coating a photoresist composite including a green pigment on the second protective layer PTL2 by a coating process, performing a soft bake process on the photoresist composite, performing an exposure process on the photoresist composite, and developing the photoresist composite to leave the photoresist composite in the second recesses RS2. The photoresist composite including the green pigment may be formed into the second color filters CF2.

Meanwhile, a pigment residue PGR may remain in the first recesses RS1 from which the photoresist composite is removed. For example, the pigment residue PGR may be the green pigment used in the formation of the second color filters CF2.

Figure 12:
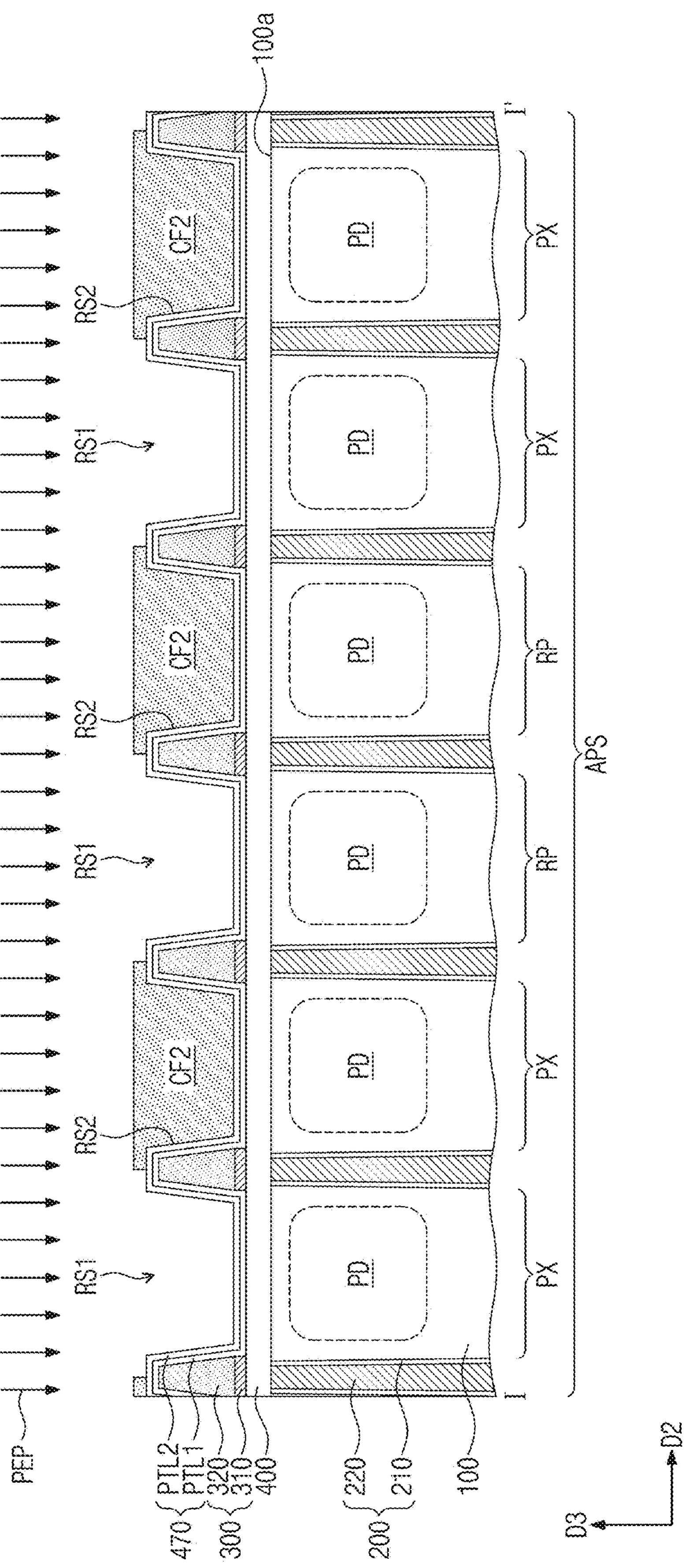

Referring to FIGS. 6 and 12, a pigment removal process PEP may be performed on the first recesses RS1 to completely remove the pigment residue PGR in the first recesses RS1. The pigment removal process PEP may include an etching process of selectively etching the pigment residue PGR.

In some example embodiments, the pigment residue PGR may be adhered onto the second protective layer PTL2. Meanwhile, the second protective layer PTL2 may be the silicon oxide layer and may have a low affinity for the pigment residue PGR, and thus the pigment residue PGR on the second protective layer PTL2 may be easily removed by the pigment removal process PEP. Thus, according to some example embodiments, it is possible to inhibit or prevent process failure that the pigment residue PGR in the first recess RS1 is not completely removed by the pigment removal process PEP.

Figure 13:
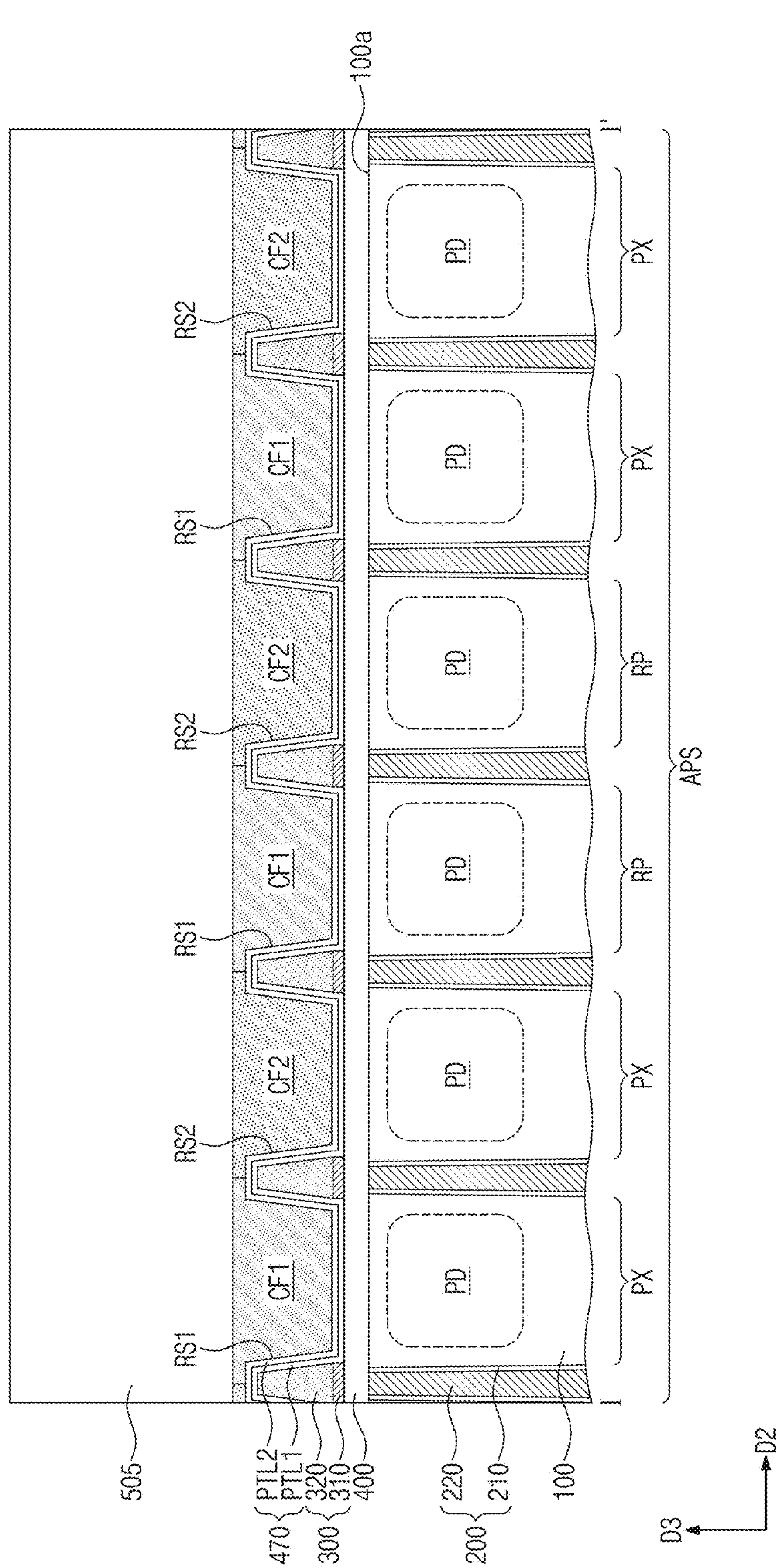

Referring to FIGS. 6 and 13, first color filters CF1 filling the first recesses RS1 may be formed. The first color filters CF1 may be formed directly on the second protective layer PTL2. The formation of the first color filters CF1 may be substantially the same as the formation of the second color filters CF2 described above.

Even though not shown in FIG. 13, the third color filters CF3 of FIG. 6 may be formed after the formation of the first color filters CF1. The formation of the third color filters CF3 may be substantially the same as the formation of the second color filters CF2 described above.

A preliminary lens layer 505 may be formed on the color filters CF. The preliminary lens layer 505 may directly cover top surfaces of the color filters CF. The preliminary lens layer 505 may be formed by a spin coating process using a transparent photoresist material or a transparent thermosetting resin.

Figure 14:
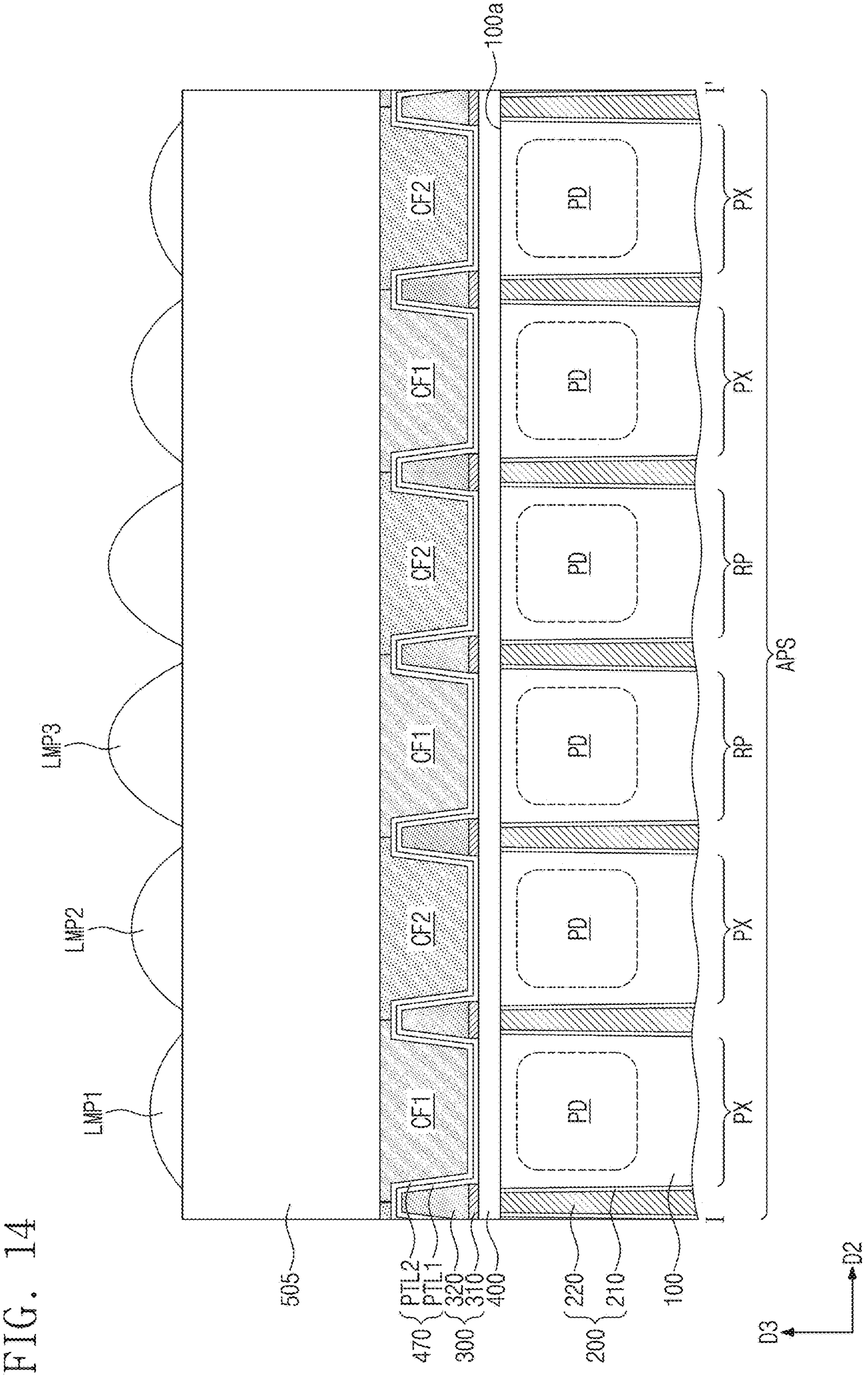

Referring to FIGS. 6 and 14, lens mask patterns LMP1 to LMP3 may be formed on the preliminary lens layer 505. The lens mask patterns LMP1 to LMP3 may include first, second and third lens mask patterns LMP1, LMP2 and LMP3.

The first and second lens mask patterns LMP1 and LMP2 may be formed on the pixel regions PX, respectively. The third lens mask patterns LMP3 may be formed on the focus pixel regions RP, respectively.

The first, second and third lens mask patterns LMP1, LMP2 and LMP3 may have different heights. For example, the height of the third lens mask pattern LMP3 may be greater than the height of the second lens mask pattern LMP2. The height of the second lens mask pattern LMP2 may be greater than the height of the first lens mask pattern LMP1.

The formation of the first to third lens mask patterns LMP1 to LMP3 may include forming photoresist patterns by a photolithography process, and reflowing the photoresist patterns. A density of the first to third lens mask patterns LMP1 to LMP3 may be increased by the reflow process to increase chemical resistance thereof. Each of the first to third lens mask patterns LMP1 to LMP3 may have a hemispherical shape due to the reflow process.

Figure 15:
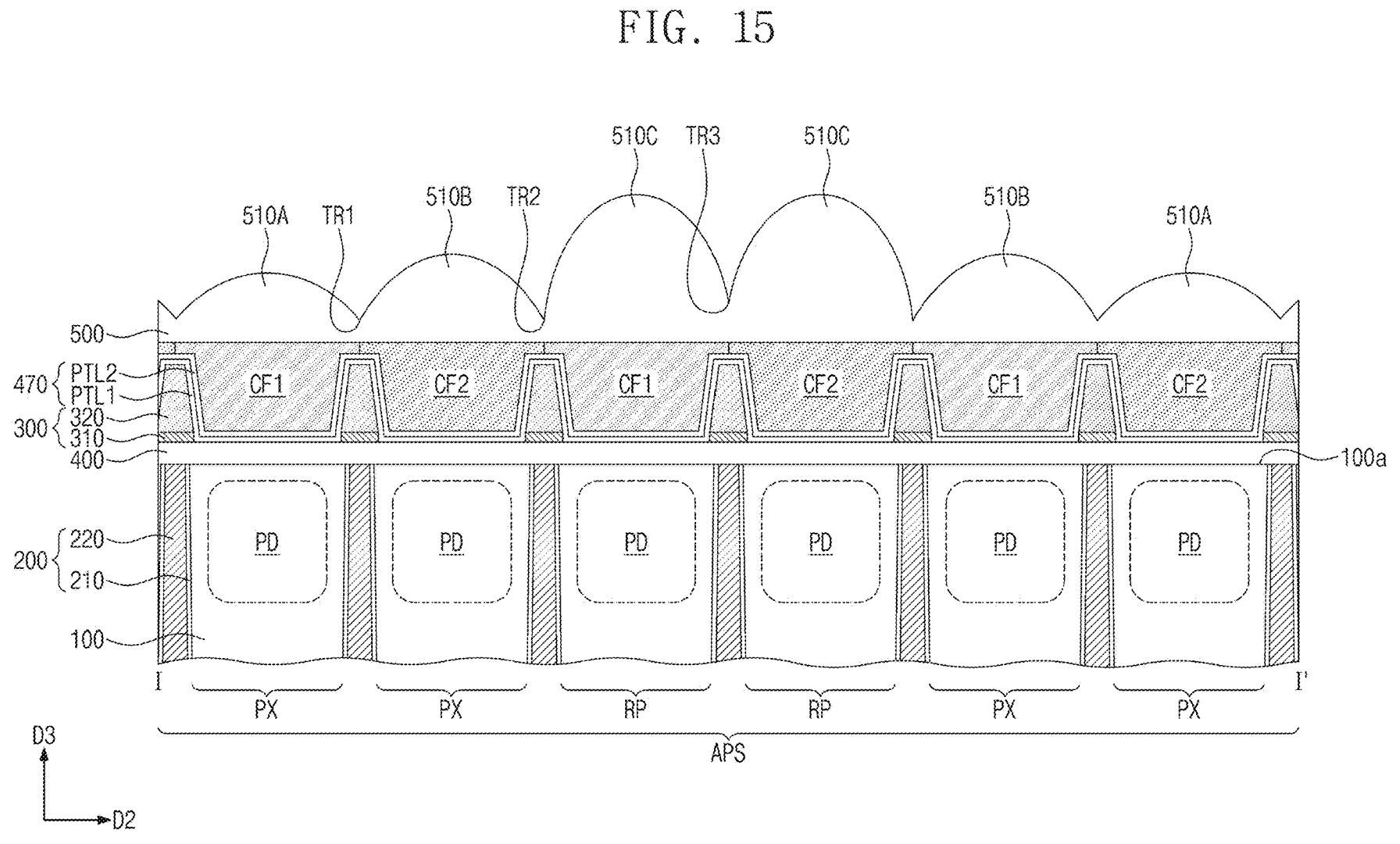

Referring to FIGS. 6 and 15, an etching process (e.g., an etch-back process) may be performed on the first to third lens mask patterns LMP1 to LMP3 and the preliminary lens layer 505 to form a micro lens layer 500.

More particularly, the shapes of the first to third lens mask patterns LMP1 to LMP3 may be transferred to the preliminary lens layer 505 by the etching process. Thus, the micro lens layer 500 may include first to third micro lenses 510A to 510C having convex hemispherical shapes.

The first to third micro lenses 510A to 510C may be transferred from the first to third lens mask patterns LMP1 to LMP3, respectively, and may have different heights. First to third troughs TR1 to TR3 may be formed between the first to third micro lenses 510A to 510C.

Referring again to FIGS. 6 and 7, a first coating layer LTO and a second coating layer ALO may be sequentially formed on the micro lens layer 500. The first coating layer LTO may be formed using a PECVD process. The second coating layer ALO may be formed using an ALD process. For example, the second coating layer ALO may be formed with a thickness in a range of 50 Å to 1000 Å. The first and second coating layers LTO and ALO may include silicon oxide.

The first coating layer LTO may be formed by the PECVD process and thus may be thin in the first to third troughs TR1, TR2 and TR3. In particular, the first coating layer LTO may not be formed in the third trough TR3 which is deepest.

However, the second coating layer ALO may be conformally formed by the ALD process and thus may have a uniform or substantially uniform thickness in the first to third troughs TR1, TR2 and TR3. Thus, the second coating layer ALO may prevent the micro lens layer 500 from being exposed and may prevent the defect (e.g., the void VD) described above with reference to FIG. 8.

The first and second coating layers LTO and ALO may include the same or substantially the same material (e.g., silicon oxide), and thus an interface therebetween may not be clearly visible through electron microscopy analysis.

However, since the first and second coating layers LTO and ALO are formed by different deposition processes, densities thereof may be different from each other even though they include the same material. For example, the first coating layer LTO may be a porous layer, and the density of the first coating layer LTO may be less than the density of the second coating layer ALO. The second coating layer ALO may be a dense layer, and the density of the second coating layer ALO may be greater than the density of the first coating layer LTO.

Figure 16:
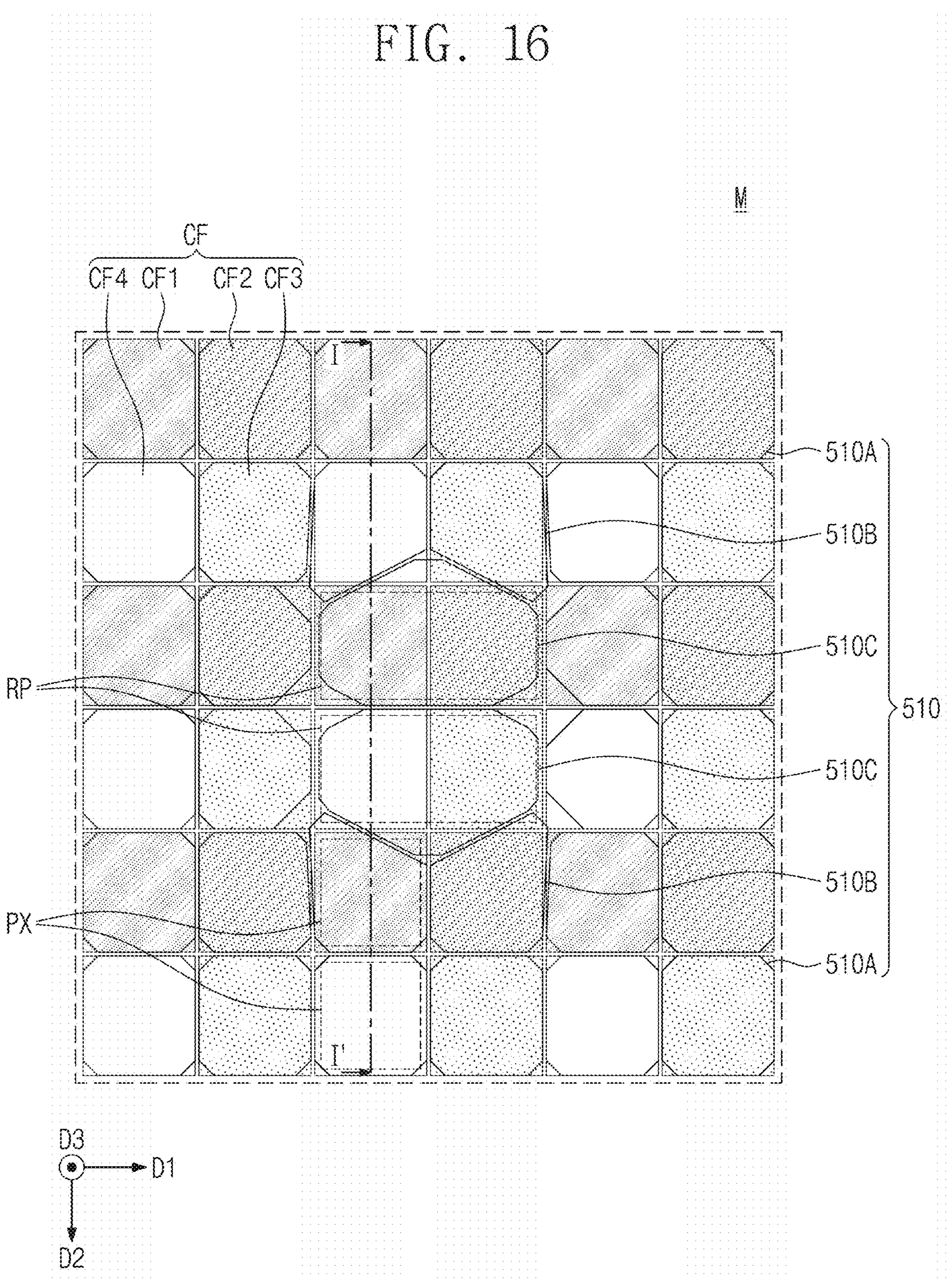
FIG. 16 is an enlarged plan view of the region 'M' of FIG. 2 to illustrate color filters and micro lenses according to some example embodiments of the inventive concepts.
Figure 17:
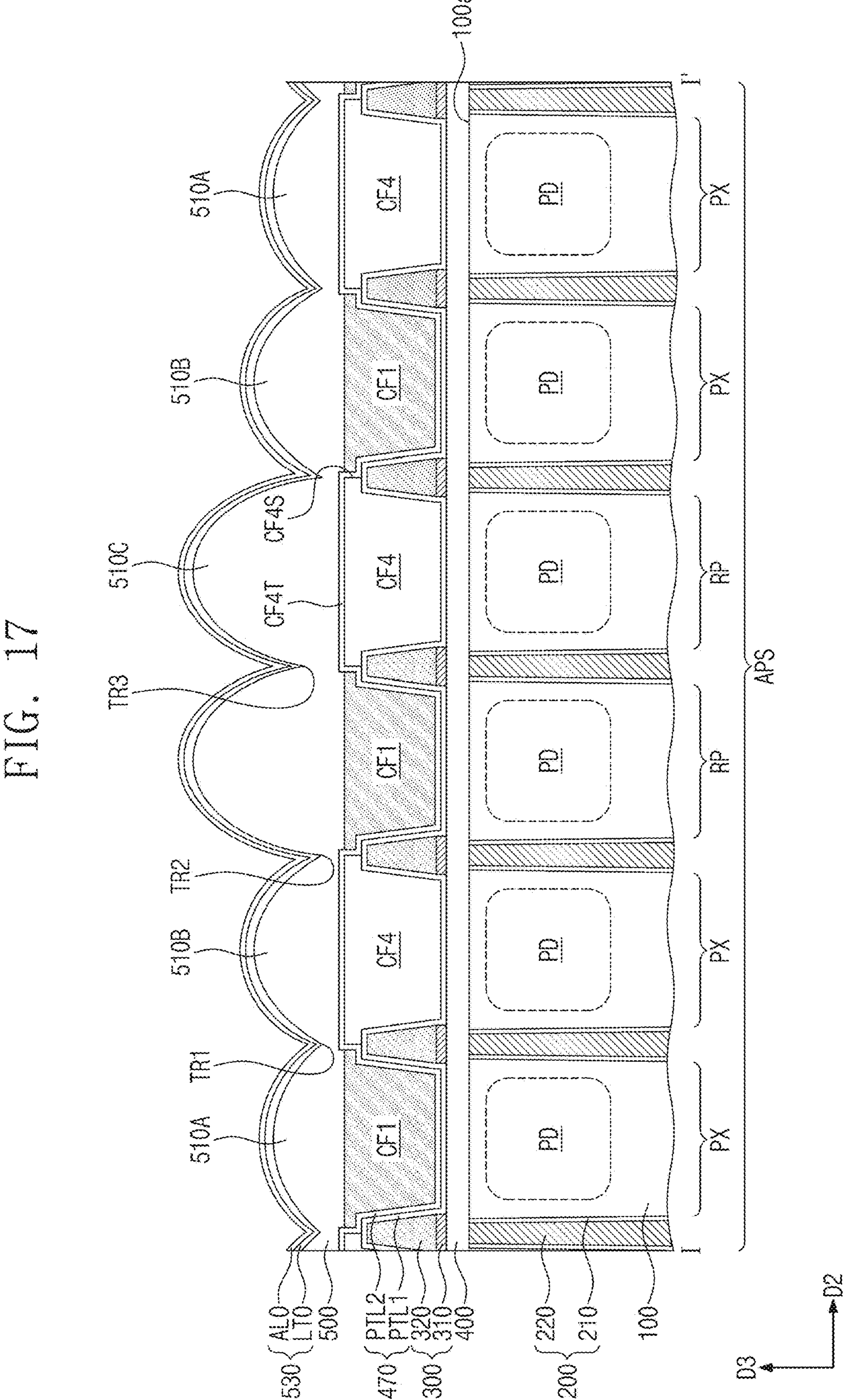
FIG. 17 is a cross-sectional view taken along a line I-I' of FIG. 16.

FIG. 16 is an enlarged plan view of the region 'M' of FIG. 2 to illustrate color filters and micro lenses according to some example embodiments of the inventive concepts. FIG. 17 is a cross-sectional view taken along a line I-I' of FIG. 16. In the example embodiments, the descriptions to the same technical features as mentioned above with reference to FIGS. 6 and 7 will be omitted and differences between the example embodiments and the above embodiments of FIGS. 6 and 7 will be mainly described, for the purpose of ease and convenience in explanation.

Referring to FIGS. 16 and 17, four color filters CF adjacent to each other may include a first color filter CF1, a second color filter CF2, a third color filter CF3, and a fourth color filter CF4. For example, the first color filter CF1 may be a red filter, the second color filter CF2 may be a green filter, the third color filter CF3 may be a blue filter, and the fourth color filter CF4 may be a white filter. The first to fourth color filters CF1 to CF4 may be arranged in a clockwise direction to constitute a color filter array. The color filter array consisting of the first to fourth color filters CF1 to CF4 may be repeatedly arranged.

Referring again to FIG. 17, the first protective layer PTL1 may directly cover the fence pattern 300 and the insulating layer 400. The second protective layer PTL2 may be provided to cover the fourth color filter CF4 as well as the first protective layer PTL1.

For example, the second protective layer PTL2 may be disposed between the first color filter CF1 and the first protective layer PTL1. The first color filter CF1 may not be in direct contact with the first protective layer PTL1 but may be spaced apart from the first protective layer PTL1 by the second protective layer PTL2.

Meanwhile, the second protective layer PTL2 may directly cover an upper sidewall CF4S and a top surface CF4T of the fourth color filter CF4 adjacent to the first color filter CF1. The fourth color filter CF4 may be in direct contact with the first protective layer PTL1. Other surfaces CF4S and CF4T of the fourth color filter CF4, which are not covered by the first protective layer PTL1, may be covered by the second protective layer PTL2.

FIGS. 18 to 21 are cross-sectional views corresponding to the line I-I' of FIG. 16 to illustrate a method of manufacturing an image sensor according to some example embodiments of the inventive concepts. In the example embodiments, the descriptions to the same technical features as mentioned above with reference to FIGS. 9 to 15 will be omitted and differences between the example embodiments and the above embodiments of FIGS. 9 to 15 will be mainly described, for the purpose of ease and convenience in explanation.

Figure 18:
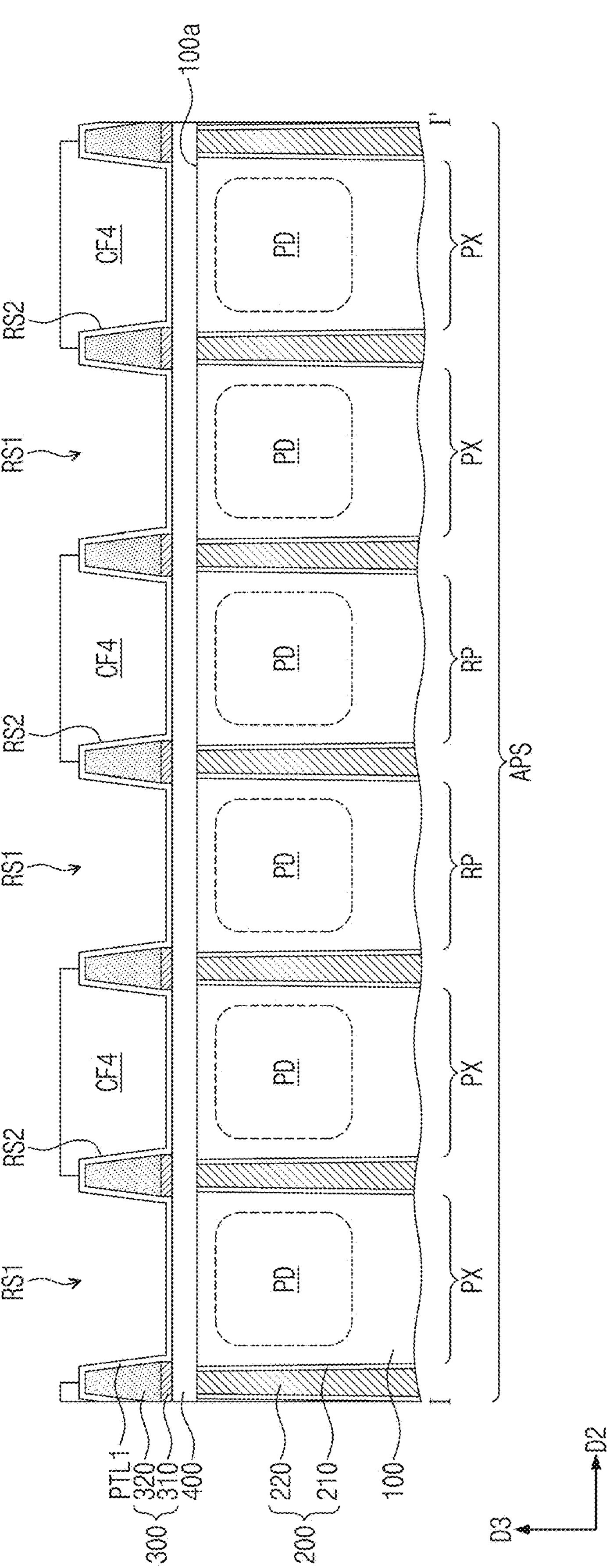
FIGS. 18, 19, 20 and 21 are cross-sectional views corresponding to the line I-I' of FIG. 16 to illustrate a method of manufacturing an image sensor according to some example embodiments of the inventive concepts.

Referring to FIGS. 16 and 18, the second protective layer PTL2 may be omitted from the resultant structure of FIG. 10. Fourth color filters CF4 may be formed on the first protective layer PTL1. The fourth color filters CF4 may fill the second recesses RS2.

More particularly, the formation of the fourth color filters CF4 may include coating a photoresist composite not including a pigment on the first protective layer PTL1 by a coating process, performing a soft bake process on the photoresist composite, performing an exposure process on the photoresist composite, and developing the photoresist composite to leave the photoresist composite in the second recesses RS2.

Since the photoresist composite does not include the pigment, the fourth color filters CF4 may be white filters. Since the photoresist composite does not include the pigment, the pigment residue PGR may not exist in the first recesses RS1 even though the fourth color filters CF4 are formed, unlike FIG. 11.

Figure 19:
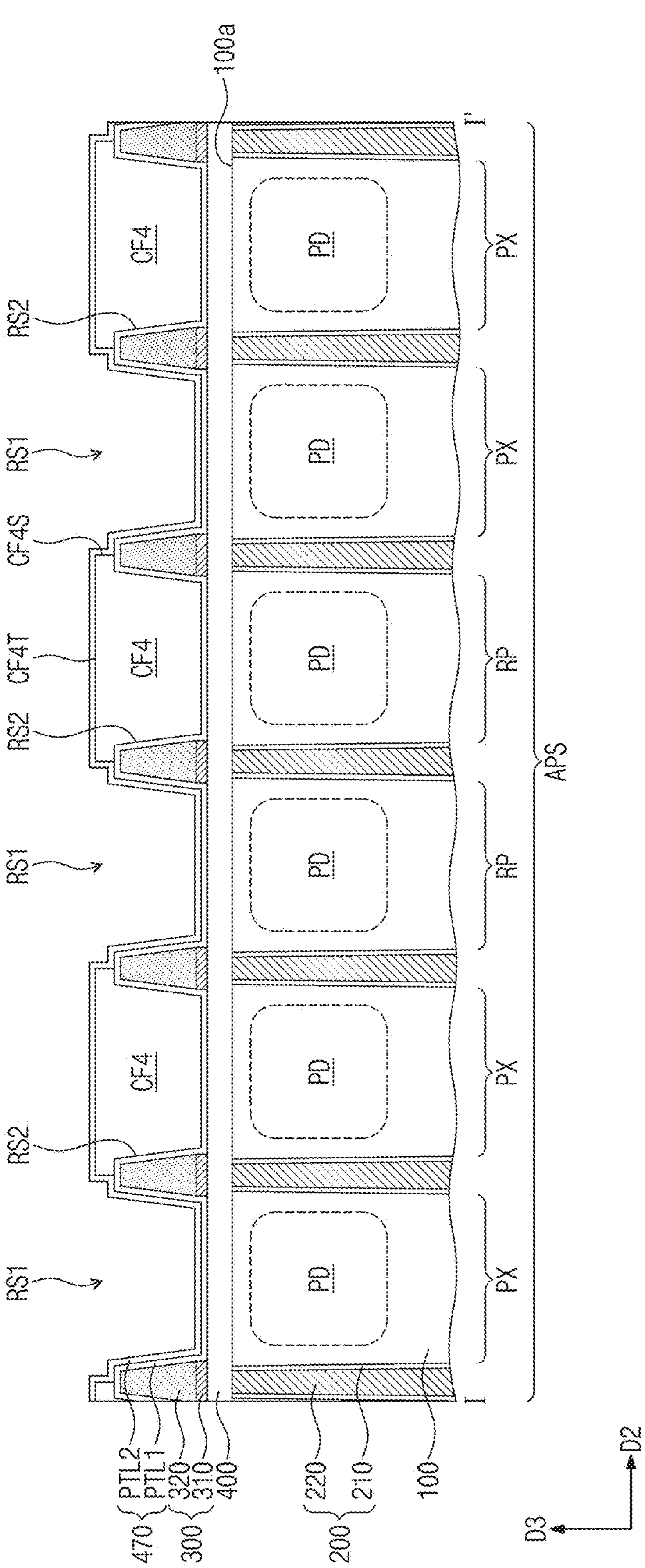

Referring to FIGS. 16 and 19, a second protective layer PTL2 may be formed on the first protective layer PTL1 and the fourth color filters CF4. The second protective layer PTL2 may be a silicon oxide layer formed using an ALD process. The second protective layer PTL2 may be formed to directly cover an exposed upper sidewall CF4S and an exposed top surface CF4T of the fourth color filter CF4. In other words, the fourth color filter CF4 may be completely capped by the second protective layer PTL2.

Figure 20:
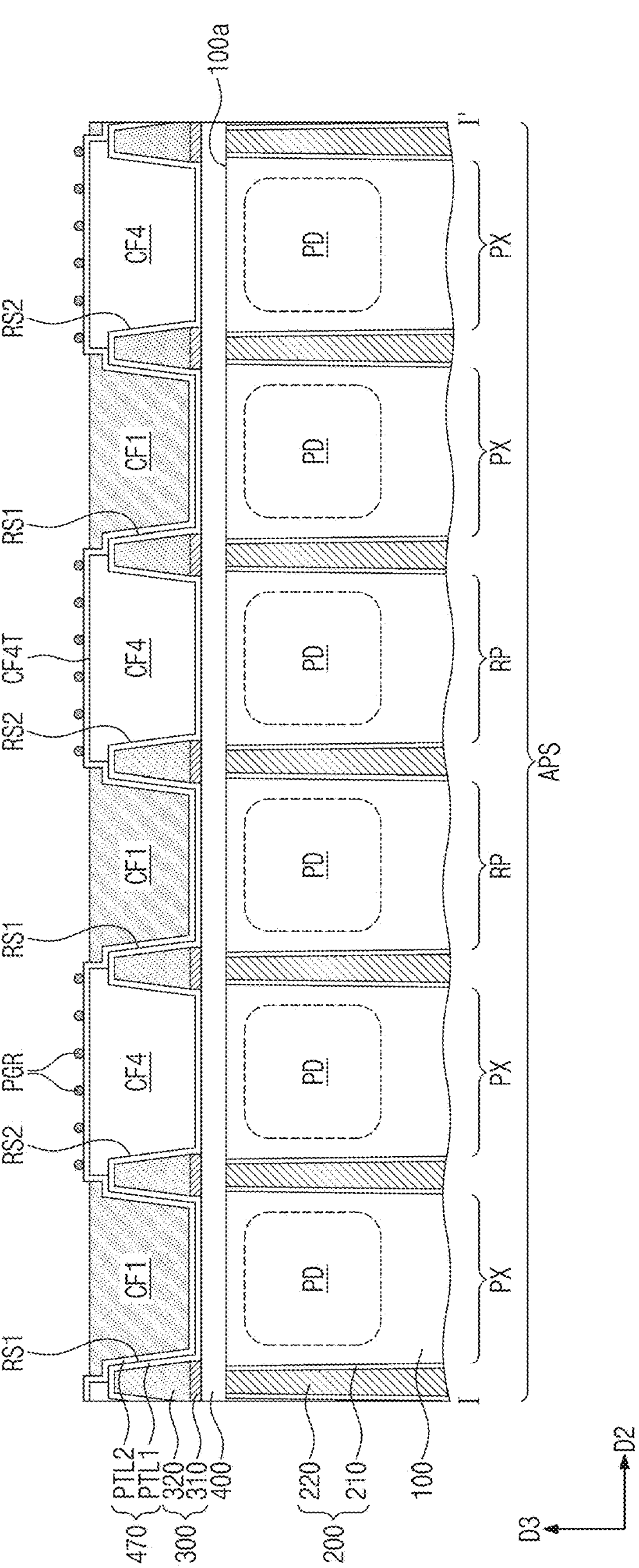

Referring to FIGS. 16 and 20, first color filters CF1 filling the first recesses RS1 may be formed. The first color filters CF1 may be formed directly on the second protective layer PTL2. Meanwhile, a pigment residue PGR caused from the first color filters CF1 may be formed on the top surface CF4T of the fourth color filter CF4 during the formation of the first color filters CF1.

Figure 21:
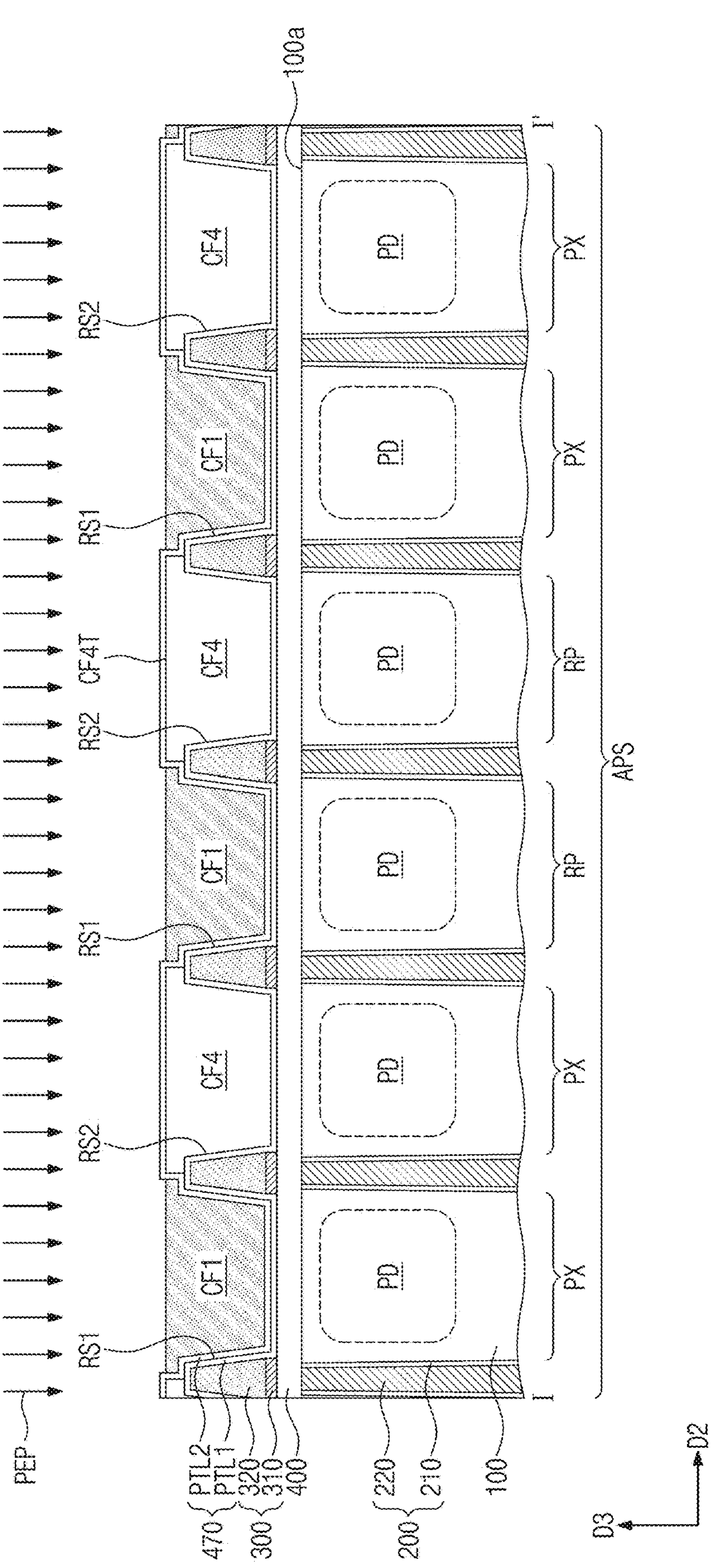

Referring to FIGS. 16 and 21, a pigment removal process PEP may be performed on the fourth color filters CF4 to completely remove the pigment residue PGR on the fourth color filters CF4. According to some embodiments of the inventive concepts, the pigment residue PGR may be adhered onto the second protective layer PTL2 capping the fourth color filters CF4. Meanwhile, the second protective layer PTL2 may be the silicon oxide layer and may have a low affinity for the pigment residue PGR, and thus the pigment residue PGR on the second protective layer PTL2 may be easily removed by the pigment removal process PEP. Thus, according to the example embodiments, it is possible to inhibit or prevent process failure that the pigment residue PGR on the fourth color filters CF4 is not completely removed by the pigment removal process PEP.

Figure 22:
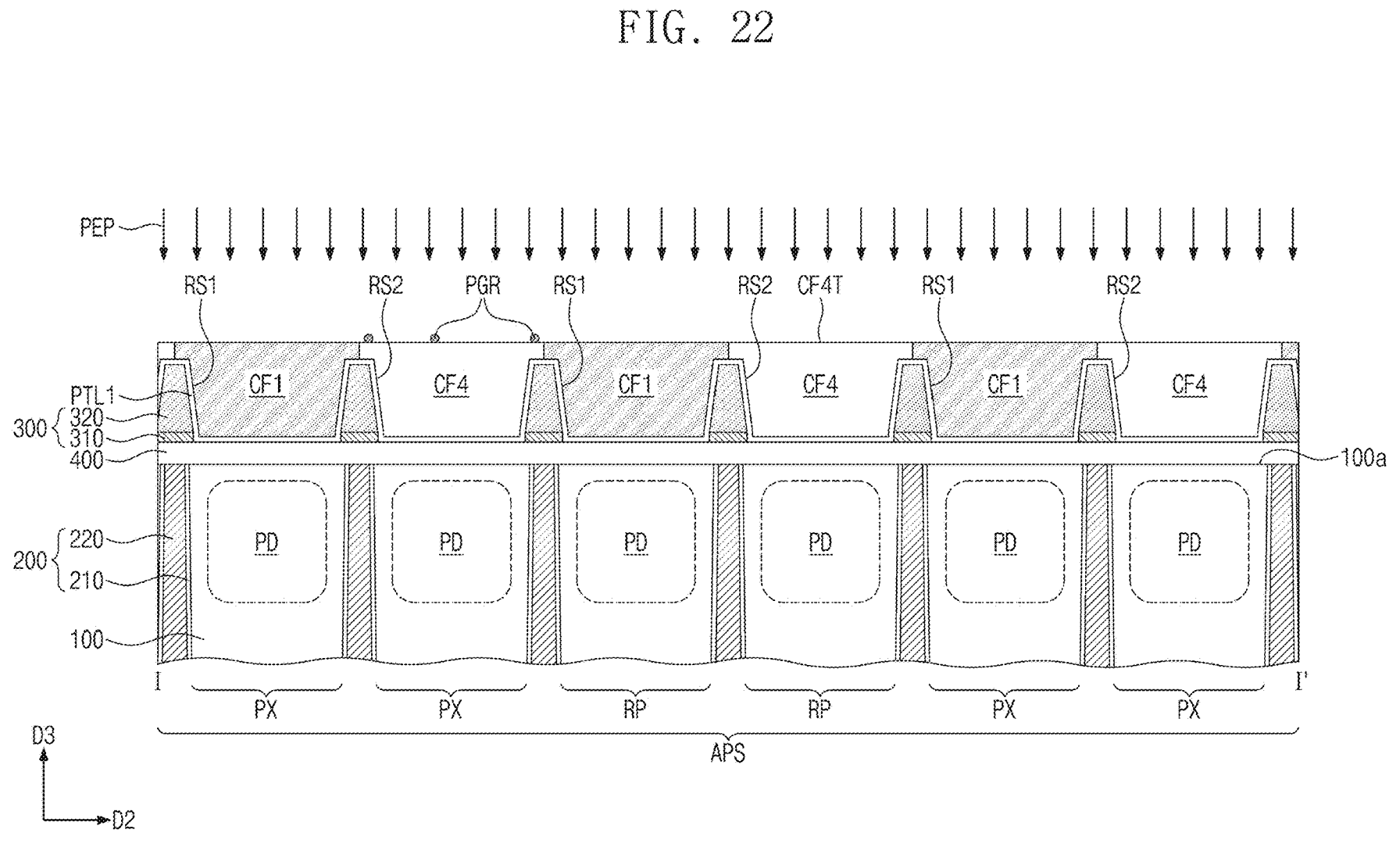

FIG. 22 is a cross-sectional view corresponding to the line I-I' of FIG. 16 to illustrate a method of manufacturing an image sensor according to another example embodiment. Referring to FIG. 22, in the comparative example, the formation of the second protective layer PTL2 described in FIG. 19 may be omitted. When the first color filters CF1 are formed, the pigment residue PGR caused from the first color filters CF1 may be adhered directly onto the top surface CF4T of the fourth color filter CF4. Meanwhile, the photoresist material of the fourth color filter CF4 may have a high affinity for the pigment residue PGR, and thus the pigment residue PGR may not be completely removed by the pigment removal process PEP described above.

If the pigment residue PGR remains on the fourth color filter CF4, the pigment residue PGR may reduce sensitivity of the fourth color filter CF4, and a line-shaped noise may occur in an image outputted from an image sensor.

On the contrary, according to some example embodiments of the inventive concepts, the second protective layer PTL2 may be formed on the fourth color filter CF4, and thus the pigment residue PGR on the fourth color filter CF4 may be completely removed. As a result, sensitivity of the image sensor according to the inventive concepts may be improved, and failure noise in an outputted image may be removed.

In the image sensor according to some example embodiments, the second protective layer between the color filter and the fence pattern may inhibit or prevent a defect that another pigment residue is adsorbed on the color filter. In addition, the second protective layer may inhibit or prevent a cross-talk phenomenon between the pixels adjacent to each other.

In the image sensor according to some example embodiments, the dense and conformal second coating layer as well as the first coating layer may be provided on the micro lens layer to inhibit or prevent a defect (e.g., a void) from occurring in the micro lens layer.

As a result, the reliability and sensitivity of the image sensor according to the inventive concepts may be improved.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While some example embodiments of the inventive concepts have been particularly shown and described, it will be understood by one of ordinary skill in the art that variations in form and detail may be made therein without departing from the scope of the example embodiments.

What is claimed is:

1. An image sensor comprising:

a substrate comprising a first surface and a second surface opposing the first surface;

a first photoelectric conversion region in the substrate;

a second photoelectric conversion region in the substrate;

an isolation pattern between the first photoelectric conversion region and the second photoelectric conversion region; and a fence pattern on the isolation pattern and vertically overlapping with the isolation pattern, wherein the fence pattern comprises:

a first fence pattern on the first surface;

a second fence pattern on the first fence pattern;

a first protective layer on the second fence pattern; and a second protective layer on the first protective layer, wherein the first protective layer covers a left-side, a top surface, and a right-side of the second fence pattern in a vertical view, wherein the second protective layer covers the left-side, the top surface, and the right-side of the second fence pattern in the vertical view, wherein the first protective layer comprises a metal material, and wherein the second protective layer comprises a silicon material.

2. The image sensor of claim 1, wherein the first protective layer has a first height on the top surface of the second fence pattern in a first direction perpendicular to the first surface, wherein the second protective layer has a second height on a top surface of the first protective layer in the first direction, wherein the top surface of the first protective layer covers the top surface of the second fence pattern, and wherein the first height is different from the second height.

3. The image sensor of claim 2, wherein the first and second protective layers comprise oxide material.

4. The image sensor of claim 2, wherein the second protective layer comprises silicon oxide.

5. The image sensor of claim 2, wherein the first protective layer comprises aluminum oxide.

6. The image sensor of claim 4, wherein the first protective layer comprises oxide.

7. The image sensor of claim 5, further comprising a color filter, wherein at least a portion of the color filter covers a top surface of the second protective layer, and wherein the top surface of the second protective layer covers the top surface of the first protective layer.

8. The image sensor of claim 6, wherein a bottom surface of the second fence pattern has a first width in a second direction perpendicular to the first direction, wherein the top surface of the second fence pattern has a second width in the second direction perpendicular to the first direction, wherein the first width is different from the second width, and wherein the bottom surface of the second fence pattern is opposing the top surface of the second fence pattern in the vertical view.

9. The image sensor of claim 8, wherein the first width is greater than the second width.

10. An image sensor comprising:

a substrate comprising a first surface and a second surface opposing the first surface;

a first photoelectric conversion region in the substrate;

a second photoelectric conversion region in the substrate;

a first micro lens disposed vertically overlapping with the first photoelectric conversion region in the substrate;

a second micro lens disposed vertically overlapping with the second photoelectric conversion region in the substrate an isolation pattern between the first photoelectric conversion region and the second photoelectric conversion region; and a fence pattern on the isolation pattern and vertically overlapping with the isolation pattern, wherein the fence pattern comprises:

a first fence pattern on the first surface;

a second fence pattern on the first fence pattern;

a first protective layer on the second fence pattern; and a second protective layer on the first protective layer, wherein the first protective layer covers a left-side, a top surface, and a right-side of the second fence pattern in a vertical view, wherein the second protective layer covers the left-side, the top surface, and the right-side of the second fence pattern in the vertical view, wherein the first protective layer comprises a first material, wherein the second protective layer comprises a second material different from the first material, and wherein a height from the first surface to an uppermost portion of the first micro lens in a first direction perpendicular to the first surface is different from a height from the first surface to an uppermost portion of the second micro lens in the first direction.

11. The image sensor of claim 10, wherein the first protective layer has a first height on the top surface of the second fence pattern in the first direction, wherein the second protective layer has a second height on a top surface of the first protective layer in the first direction, wherein the top surface of the first protective layer covers the top surface of the second fence pattern, and wherein the first height is different from the second height.

12. The image sensor of claim 11, wherein the first and second protective layers comprise oxide material.

13. The image sensor of claim 12, wherein the second protective layer comprises silicon oxide.

14. The image sensor of claim 12, wherein the first protective layer comprises aluminum oxide.

15. An image sensor comprising:

a substrate comprising a first surface and a second surface opposing the first surface;

a first photoelectric conversion region in the substrate;

a second photoelectric conversion region in the substrate;

an isolation pattern between the first photoelectric conversion region and the second photoelectric conversion region; and a fence pattern on the isolation pattern and vertically overlapping with the isolation pattern, wherein the fence pattern comprises:

a first fence pattern on the first surface;

a second fence pattern on the first fence pattern;

a first protective layer on the second fence pattern; and a second protective layer on the first protective layer, wherein the first protective layer covers a left-side, a top surface, and a right-side of the second fence pattern in a vertical view, wherein the second protective layer covers the left-side, the top surface, and the right-side of the second fence pattern in the vertical view, and wherein the first protective layer comprises a metal material.

16. The image sensor of claim 15, wherein the first and second protective layers comprise oxide.

17. The image sensor of claim 15, wherein the first protective layer has a first height on the top surface of the second fence pattern in first direction perpendicular to the first surface, wherein the second protective layer has a second height on a top surface of the first protective layer in the first direction, wherein the top surface of the first protective layer covers the top surface of the second fence pattern, and wherein the first height is different from the second height.

18. The image sensor of claim 15, wherein the first protective layer comprises aluminum oxide.

19. The image sensor of claim 13, wherein the first protective layer comprises aluminum oxide.

20. The image sensor of claim 14, wherein the first protective layer comprises aluminum oxide.

* * * * *